(12) United States Patent
Kumar

(10) Patent No.: US 9,954,188 B2
(45) Date of Patent: Apr. 24, 2018

(54) HYBRID COMPOSITE NANOMATERIALS

(71) Applicant: Sumeet Kumar, Trieste (IT)

(72) Inventor: Sumeet Kumar, Trieste (IT)

( * ) Notice: Subject to any disclaimer, the term of this patent is extended or adjusted under 35 U.S.C. 154(b) by 221 days.

(21) Appl. No.: 14/768,080

(22) PCT Filed: Feb. 25, 2014

(86) PCT No.: PCT/IB2014/059220
§ 371 (c)(1),
(2) Date: Aug. 14, 2015

(87) PCT Pub. No.: WO2014/132183
PCT Pub. Date: Sep. 4, 2014

(65) Prior Publication Data
US 2015/0380665 A1 Dec. 31, 2015

(30) Foreign Application Priority Data
Mar. 1, 2013 (IT) .............................. UD2013A0030

(51) Int. Cl.
*H01L 31/02* (2006.01)
*H01L 51/42* (2006.01)
(Continued)

(52) U.S. Cl.
CPC ............ *H01L 51/0073* (2013.01); *C08K 9/02* (2013.01); *C08K 9/04* (2013.01); *C09K 11/06* (2013.01);
(Continued)

(58) Field of Classification Search
CPC .................... Y02E 10/542; Y02E 10/54; H01L 2031/0344; H01L 51/4213; H01L 51/426; H01L 51/4266; H01G 9/2059
See application file for complete search history.

(56) References Cited

U.S. PATENT DOCUMENTS

2001/0045547 A1* 11/2001 Senecal ................ D01D 5/0007
252/501.1
2012/0015266 A1* 1/2012 Melo Faus ............... B01J 21/10
429/425

FOREIGN PATENT DOCUMENTS

| WO | 99/35185 A1 | 7/1999 |
| WO | 00/09599 A1 | 2/2000 |
| WO | 2007/065859 A1 | 6/2007 |

OTHER PUBLICATIONS

Hong Chen et al., "White-light hydroalcite-like compound emission from the incorporation of red-, green-, and blue-emitting metal complexes", Optical Materials Express, Optical Society of America, U.S., vol. 3, No. 1, Dec. 20, 2012, pp. 105-113.
(Continued)

*Primary Examiner* — Susan D Leong
(74) *Attorney, Agent, or Firm* — Enshan Hong; VLP Law Group LLP

(57) ABSTRACT

A hybrid composite nanomaterial comprising a hydrotalcite like layered double hydroxide compound provided with one or more lanthanide elements inserted into the 2D layers and one or more organic-inorganic (DONOR/ACCEPTOR) compounds, or acids or salts thereof, intercalated between them as shown in FIG. 1 and FIG. 31. The innovative co-axial design for encapsulating the active layer(s) of a hybrid organic-inorganic solar cell, together with the insertion of the hydrotalcite like nanocomposite, for light energy down and up conversion, thereby not only providing the active material more convertible energy, but also providing the opportunity to incorporate in situ the co-axial geometry or envisage a standalone pair of a Photoelectrochemical (PEC) and Fuel cell (FC), to work in parallel to the organic inorganic solar cell, or as standalone respectively.

16 Claims, 19 Drawing Sheets

(51) Int. Cl.
  *H01L 51/00* (2006.01)
  *C08K 9/02* (2006.01)
  *C08K 9/04* (2006.01)
  *H01G 9/20* (2006.01)
  *C09K 11/06* (2006.01)
  *H01L 31/0256* (2006.01)
(52) U.S. Cl.
  CPC ... *H01G 9/2059* (2013.01); *C09K 2211/1088* (2013.01); *H01L 51/4213* (2013.01); *H01L 2031/0344* (2013.01); *Y02E 10/542* (2013.01); *Y02P 70/521* (2015.11)

(56) References Cited

OTHER PUBLICATIONS

Sumeet Kumar et al, "Synthesis and characterization of host-guest materials obtained by inserting coubarin into hydrotalcit layers for LED applications" Phys. Status Solidi A 206, No. 9, 2171-2176 (2009).
Zi Gu et al., "Hierarchical layered double hydroxide nanocomposites: structure, synthesis and applications," Chem Commun., 2015, 51, pp. 3024-3036.
PCT Written Opinion dated Feb. 23, 2015 by the international preliminary examination authority for the related PCT Application No. PCT/IB2014/059220.
International Preliminary Report on Patentability completed on Jun. 10, 2015 by the international preliminary examination authority for the related PCT Application No. PCT/IB2014/059220.

* cited by examiner

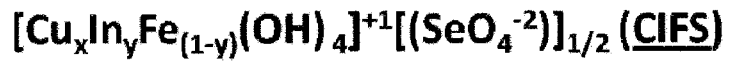
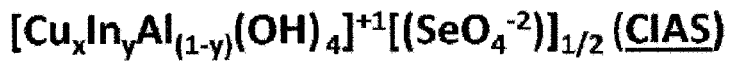
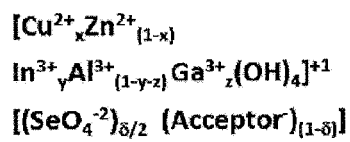
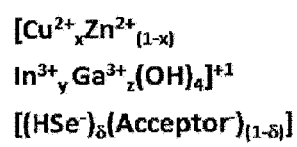
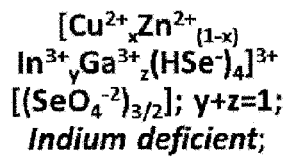
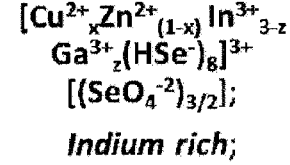
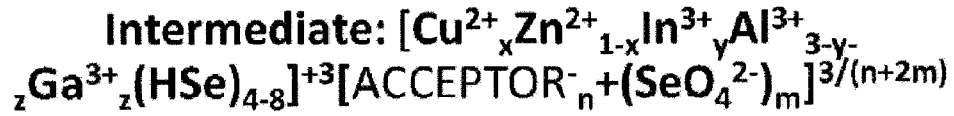
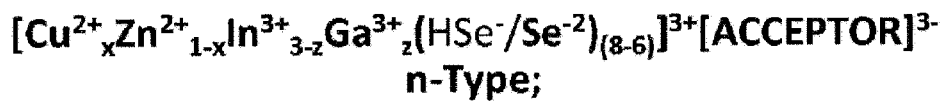
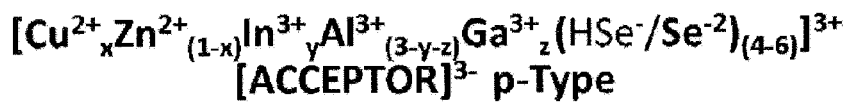
Figure 3

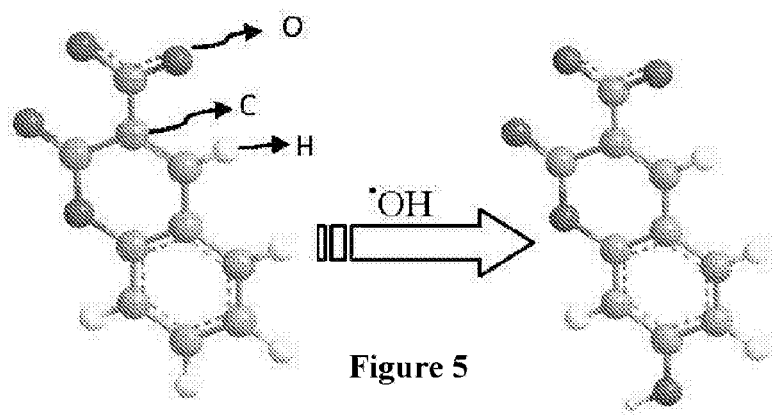
Figure 5
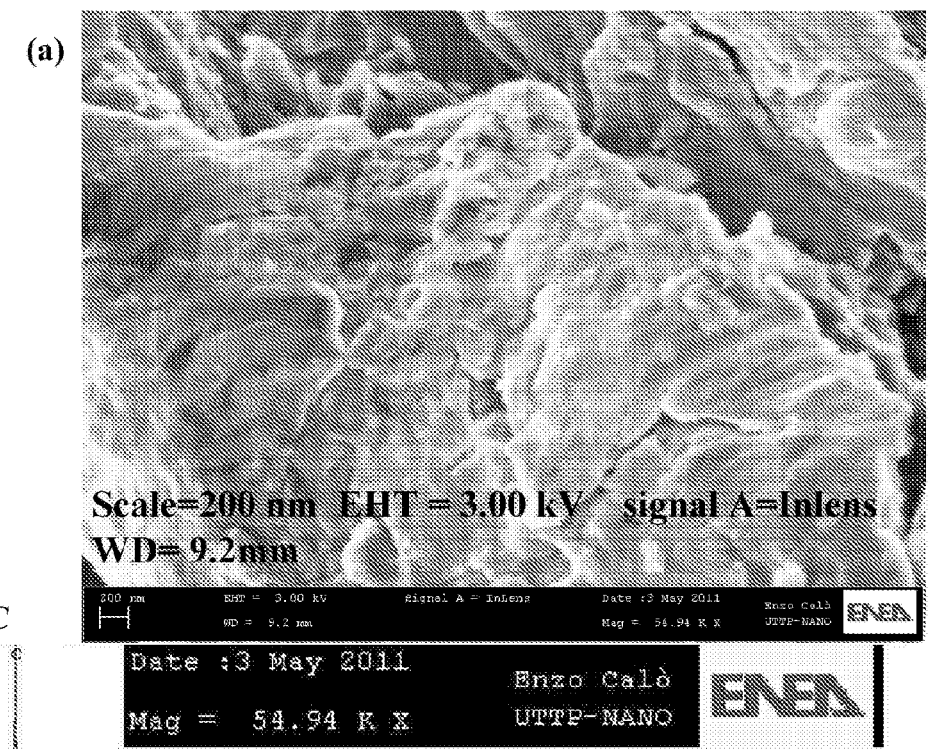
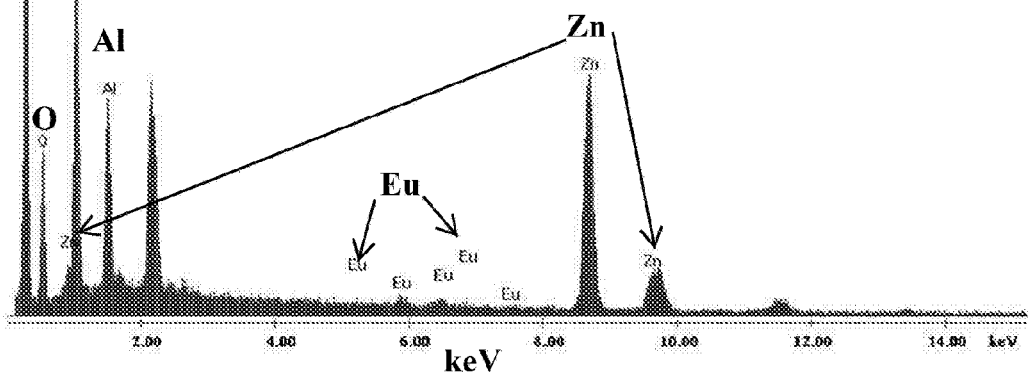
Figure 6

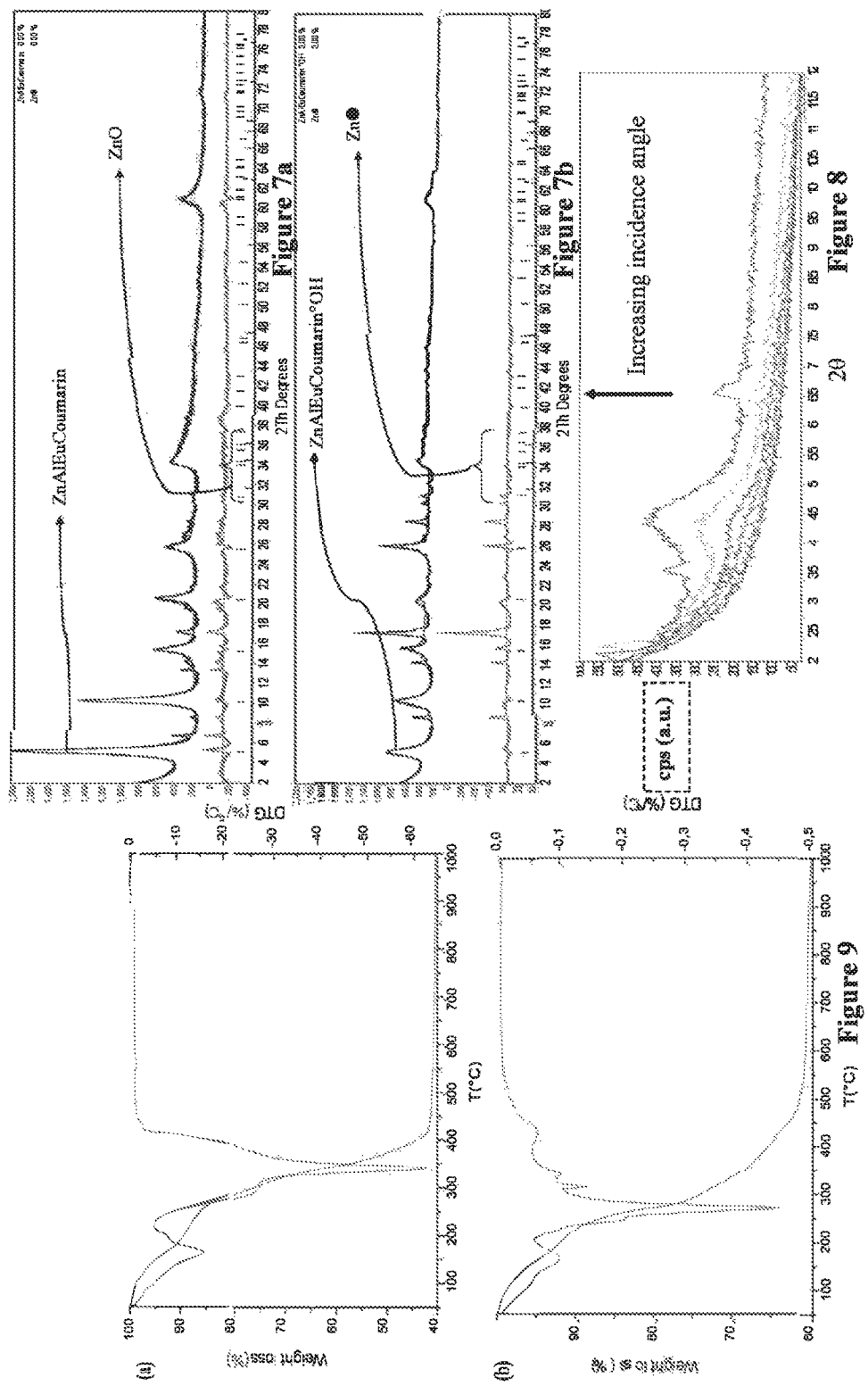

HYBRID COMPOSITE NANOMATERIALS

PRIORITY CLAIM

This is a U.S. national stage of application No. PCT/IB2014/059220, filed on Feb. 25, 2014. Priority is claimed on the following application: Country: IT, Application No.: UD2013A000030, Filed: Mar. 1, 2013, the content of which is/are incorporated here by reference.

FIELD OF THE INVENTION

The present invention relates to novel hybrid composite nanomaterials and their use, for example, in the field of production of solar cells, in particular organic-inorganic solar cells, or in the field of targeting chemical sensors.

Furthermore, the present invention relates to methods for obtaining such novel hybrid composite nanomaterials, so that they can be encapsulated into the co-axial geometry based hybrid organic inorganic photoelectrochemical or Fuel cell, in contemporary to the organic-inorganic solar cells or any complementary power source.

BACKGROUND OF THE INVENTION

In recent years non-vacuum deposition techniques with a capability to prepare uniform thin films using low cost techniques such as paste coating and electro chemical deposition has gained much attention among the researchers. From among the various low cost synthesis techniques, solution based synthesis process is considered to be as a promising alternative among expensive techniques with relatively simple procedures and low initial costs for its industrializing.

Thus, there is a need to provide an effective and low cost synthesis process for producing such uniform thin films.

It is known that Copper Indium Gallium (di)Selenide ($CuIn_{1-x}Ga_xSe_2$ or CIGS where x can vary from 1, corresponding to pure copper indium selenide, to 0, corresponding to pure copper gallium selenide) is a I-III-VI$_2$ semiconductor material, in particular a direct bandgap semiconductor useful for the manufacture of solar cells. In particular, CIGS is a tetrahedically bonded semiconductor, with the chalcopyrite crystal structure and a bandgap varying continuously with x from about 1.0 eV (for copper indium selenide) to about 1.7 eV (for copper gallium selenide). The material is a solid solution of copper indium selenide (often abbreviated "CIS") and copper gallium selenide. [0006] CIGS is used as light absorbed material for thin-film solar cells. Device made with CIGS belong to the thin-film category of photovoltaics (PVs). Typically, because the material strongly absorbs sunlight, a much thinner film is required than other semiconductor materials. Solution phase synthesis of CIGS materials, via mechanochemical synthesis approach are known e.g. in the reference entitled "Structural studies of mechano-chemically synthesized $CuIn_{1-x}Ga_xSe_2$ nanoparticles".

WO 2007/065859 discloses a process for preparing organically modified layered double hydroxide, while WO 99/35185 on the other hand discloses a process for preparing organically modified layered double hydroxides (LDHs) where the organic anion is introduced into the LDH via ion exchange, carried out by suspending the LDH in water, following which the pH<4 condition is imposed externally. Further the authors describe the addition of organic anions to the suspension adjusting the pH of the solution to >8. Moreover as observed by WO 2007/065859 this process is rather complex and generally renders ionic waste stream.

WO 00/09599 on the other hand describes the preparation of LDH comprising organic anions as intercalating anions. These modified LDHs can be prepared in various ways, with use being made of the salts of divalent and trivalent metal ions, such as the chloride salts of magnesium and aluminium or sodium aluminates. The processes described in WO 00/09599 require salts which will at least partially end up in the waste stream, still an undesirable effect.

In summary, the synthesis processes described into the present state of the art, urges a strong need for a less waste recurring and faster synthesis scheme.

There is thus a need to provide a simpler and faster process for preparing innovative composite nanomaterials. Organic photo voltaic (OPVs) offer the potential to greatly decrease the cost and availability of photovoltaic energy due to lower material and manufacturing costs. A typical organic photovoltaic device architecture uses the so called bulk hetero junction (BHJ) configuration which consists of a polymer electron donor (p-type) and fullerene-derivative electron acceptor (n-type) mixture in the active layer. A typical organic photovoltaic bulk hetero junction device includes a glass or PET layer, a poly(3,4-ethylenedioxythiophene)poly(styrenesulfonate), or PEDOT:PSS layer, which is a transparent, conductive polymer mixture of two ionomers, a donor(p-type):acceptor(n-type) layer and a metal cathode layer. Generally, the modern p-type electronic polymer may include poly(3-hexylthiophene) (P3HT) or new generation of low-bandgap conducting polymers, while until now, as the n-type material, methanofullerene phenyl-C61-butyric-acid-methyl-ester ([60]PCBM) has been almost exclusively used and some attempts have also been made with [70]PCBM. Various strategies have been tried to improve the performance of the fullerene derivative (n-type), with varying degrees of successes into: increasing the optical absorption of the formed active layers, improving its solubility with the constituent specie forming the BHJ, improving its miscibility with the p-type polymer and increasing the energy level of the Lowest Unoccupied Molecular Orbital (LUMO). In context of the LUMO "tuning" of the acceptor (n-type) molecule; it has been shown that the open circuit voltage ($V_{oc}$) of the solar device is a function of the energy gap between the Highest Occupied Molecular Orbital (HOMO) in the donor and the LUMO in the acceptor. As a result, increasing the LUMO in a wide range of donors could significantly increase $V_{oc}$ when they are paired with e.g. P3HT and other acceptor polymers with similar properties.

However, there are drawbacks with current organic photo voltaic (OPV) technology which can be summarized as: 1). Not efficient Absorption, 2). Not enough charge separation, 3). Not enough charge transport.

There is thus a need to provide and improve hybrid composite nanomaterials to overcome at least one of the drawbacks of the prior art, such as to obtain efficient light absorption, enough charge separation and enough charge transport in OPV cells and apparatuses.

SUMMARY OF THE INVENTION

According to embodiments, a hybrid composite nanomaterial is provided. In one embodiment, the hybrid composite nanomaterial includes a hydrotalcite like layered double hydroxide compound provided with one or more lanthanide elements inserted into the 2D layers and one or more organic compounds, or acids or salts thereof, intercalated between them. E.g. of the lanthanide elements: $Nd^{3+}$, $Sm^{3+}$, $Eu^{3+}$, $Gd^{3+}$, $Er^{3+}$, $Tm^{3+}$ and $Yb^{3+}$.

Embodiments described herein relate to a low cost one pot synthesis procedure, hydrothermal synthesis route to achieve layered materials which can function e.g. as light energy down conversion material ($UV_{abs} \rightarrow Vis_{emission}$) and/or as light energy capturer e.g. $CuInGaSe_2$ (CIGS) like materials. Moreover, embodiments of the present disclosure may relate to the addition with lanthanide ions insertion into the layered materials together with the organic intercalates. In particular the intercalates having at least one of the functional group from among the following: Hydroxyl (R—OH), Carbonyl ($R_1$—C=O—$R_2$), Carboxyl (RCOOH), Amino ($RNH_2$), Phosphate ($ROP(OH)_2$=O), Sulfhydryl (R—SH) and pertain non exclusively to the class of Enzymes or Proteins, Porphyrin or Cannabis. For instance, at least one organic or inorganic moieties, or their "Derivatives", from among: Azole, Polybenzimidazole, Polythiophene, Fullerene, or acids (Perfluorosulfonic acid, Deoxyribonucleic acid, HEME B, Delta 9 TetraHydroCannabinol or Cannabidiol (CBD) or Coumarin-3-carboxylic acid (Coumarin) or Fluorescein or other Dye) or salts thereof, intercalated between them.

Lanthanide(s) inserted layered double hydroxide like materials provide promising results in their capability of light energy down conversion materials, and embodiments herein described, thereby providing an innovative synthesis scheme for the development of CIGS like layered solar cell materials, hence defining the possibility of obtaining an array of the standard CIGS like layers, with a possible intercalation of organic species commonly used as Acceptor materials in organic photo voltaic (OPV), thanks to the net positive charge developed onto the CIGS like 2D layers because of the choice of M(II) i.e. $Cu^{2+}$ and M(III) i.e. $In^{3+}$, $Ga^{3+}$ in this case in particular. Doping with $Zn^{2+}$ and $Al^{3+}$ has also been predicted onto the above CIGS like 2D materials with an aim towards realizing, p-type or n-type CIGS replica materials.

The drawback in the prior art of not enough light absorption can be overcome with hybrid composite nanomaterial(s) according to embodiments described herein of a hybrid "Ln" doped layered double hydroxide's (e.g. the synthesized material Component1 from now on) property of energy down conversion, has been proven by the positive results of Component1 over cSi Solar cells (Modules of which are normally found to have an PCE of ~14-18%), the increase in external quantum efficiency (EQE) with the utilization of the Component1 as a light energy down conversion material is found out to be ~100% inside the UV zone (350-370 nm); thereby having a corresponding increase into the PCE of about 2-5%.

FIG. 1 schematically shows embodiments of the one-pot synthesis of hybrid composite nanomaterial(s), e.g. Component1, according to the present disclosure with the abbreviated chemical names of the organic molecules and that of the interacting precursors. In FIG. 1 $M(II)NO_3$ corresponds to the hydrated nitrate salt of Zinc i.e. $Zn(NO_3)_2$ and M(III) ($NO_3$), with M(III) being selected between Aluminium and Europium, corresponds to the hydrated salts of $Al(NO_3)_3$ and $Eu(NO_3)_3$.

Moreover, when talking about OPV, which generally have been proven as effective as 6% into the conversion of solar radiation (as far as known), keeping all the factors the same, this marginally small increase becomes yet more important on a normal 2-dimensional surface area based OPV standard solar cell, in which the low band gap donor molecule inside the bulk hetero junction (BHJ) can also absorb the UV spectrum (on down converted with the light transparent Component1's presence).

Furthermore, the need of innovative ideas in synthesizing a hybrid layered material, capable of absorbing into the UV and emitting into the visible (where existing cSi based solar cell are active to their maximum efficiency, see discussion in relation to Example 2 below) is rather emphasized in the prior art, see e.g. reference: Metallated conjugated polymers as a new avenue towards high-efficiency polymer solar cells, Nature Materials 6, 521-527, 2007, by providing a high yielding OPV based on a low band gap (1.85 eV) active material blend, thereby the use of energy down conversion material in conjugation to a similar low band gap materials will inevitably increase the absorbing power of the polymer (donor), which in turn can generate more exciton (i.e. a mobile concentration of energy in a crystal formed by an excited electron and an associated hole) pairs and thus an increased charge transfer (to acceptor molecules) can be expected, as in OPV's in particular.

Hence, with the application of hybrid Organic-Inorganic Ln-doped layered double hydroxide, also called the Component1, it has been observed an enhancement into the external quantum efficiency (EQE) of one of the cSi based solar cells, because of the capability of Component1 in transferring the UV radiation to the visible (red emission of Eu: For example), a typical property of an energy down conversion materials. It is to be noted that cSi is most active into capturing the photons and generating the electron-hole pairs when it comes to the visible part of the solar spectrum. However, going a step further and based onto the initial success in having created for the first time, composite fibers utilizing the electro spinning technique (or produced via similar spinning techniques e.g. Wet, Dry, Melt, Extrusion, Direct, and Gel Spinning, at micro or macro level), in an innovative way, it is also included in the present disclosure, the capability of generating highly efficient quasi ~1D solar cell with expected PCE of more than the minimum necessary (~10%) for replacing the rather expensive cSi based solar cell technology at commercial level.

Embodiments described herein relate to the successful insertion, one at a time, of lanthanide elements ($Sm^{3+}$, $Eu^{3+}$ and $Gd^{3+}$) into the two-dimensional (2D) layers of a hydrotalcite (also known as HTLC) like layered double hydroxide (LDH) compound via self assembly process occurring in the presence of chelating organic species at hydrothermal conditions (high T, P, t) under a novel single step one-pot synthesis; for instance with 80<T<150 C and for 8<t<12 hr in a sealed container, such as a Teflon container. In the context of the present disclosure, T=Temperature in Degree Celsius, t=time in hrs and P=pressure generated as a function of the empty space, strategically left 25% of the total volume, into the sealed Teflon container storing in itself the precursor solution; thereby following the one-pot synthesis. The synthesized material is found to retain the property of the organic specie(s), together with providing them enhanced temperature stability and demonstrating a better transparency to light.

LDH materials are layered materials with positively charged layers and weakly bound, often exchangeable, charge balancing anions located in the interlayer region. LDH materials' default anions, depending on precursor salts, can be easily substituted by replacing the anions located in the interlayer region under a one-pot hydrothermal synthesis. Hydrotalcites are an example of LDH material, consisting of brucite-like structures (brucite is the mineral form of magnesium hydroxide $Mg(OH)_2$), where a partial $Mg^{2+}$ substitution by $Al^{3+}$ ions has taken place, and to balance the positive charge generated as a consequence of this substitution in the layers, anions, usually carbonate, are located between the layers, co-occupied by water molecules. The carbonate anions that lie between the structural layers are weakly bound, so hydrotalcite has anion exchange capabilities. Natural hydrotalcite has formula $Mg_6Al_2(OH)_{16}(CO_3) \cdot 4H_2O$ and the hydrotalcite-like compounds can be generally described by the empirical formula:

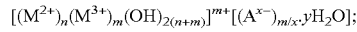

where $M^{2+}$ and $M^{3+}$ are metal cations, A represents the x-valent anion needed to compensate the net positive charge, x is the charge of the anion and y is the number of interlayer water molecules. Normally the m/(m+n) ratio may vary from 0.17 to 0.33 depending on the particular combinations of di- and trivalent elements.

Embodiments described herein may relate to a composite nanomaterial ZnAlEuCoumarin:Fluorescein, which has also been called as Component1, is explicitly a hybrid organic-inorganic material (i.e. a mixture of organic intercalated "guest" and inorganic "host") structured such that the guest molecule(s) preserve their property of energy down conversion from UV to visible. Insertion of lanthanide elements in such a one-pot fashion is not known in the art and furthermore, owing to the possibility of having diverse choice of $M^{2+}$ and $M^{3+}$ ions, (also possible in their oxidised and reduced form), attempts to realize a $CuIn_xGa_{(1-x)}Se_2$ (CIGS) like nanomaterial via low cost, solution phase, one pot hydrothermal like synthesis is also contemplated in the present disclosure. Obtaining a layered double hydroxide material is generically known, but with a rather different synthesis route and without exploiting the possibility of self assembly in a one-pot fashion. Thereby the approach of lanthanide ion insertion into the layered materials is a totally new concept when it comes to the successful lanthanide insertion into the layers, backed up with the results demonstrated in the example cases.

Two organic molecules such as Molecule1: (Coumarin3Carboxylate anion) and Molecule2: (Fluorescein sodium salt), in specific can be intercalated in solution phase (when exposed to high Temperature, Pressure conditions), inside the 2D layered host structure due to the layered structure attaining a net positive charge because of charge imbalance, e.g. via Substitution of M(II) by M(III) ions under high temperature and pressure conditions, with the dopant Ln ions further substituting the M(III) sites via self assembly.

The intercalation of the anionic organic molecules occurs via a process of self-assembly under high temperature and pressure conditions necessary for replacing the default metal salt anions (e.g. Nitrates for example) and substituting the M(II) ions into the brucite-like structure with that of the trivalent metal ions M(III) coordinating them octahedrally with its near neighbours. The successful intercalation has been characterized via principle techniques like: XRD/NMR/FTIR/TGA and SSPL.

Component1's energy down conversion property from UV to Visible remains protected, benefiting the inorganic host, until 300-350 degree Celsius. Thus its application at high temperature conditions is also an envisaged possibility falling within the present invention. Moreover Component1 is found to retain a good transparency towards light in the visible spectrum (being high band gap materials) plus numerous other advantages described ahead.

Test on cSi based solar cell: Component) has been tested via depositing the same, following a simple method of drop casting a solution with the dispersions of Component1 into a highly volatile solvent. An increase in the external quantum efficiency (EQE) was measured due to the UV (350-370) conversion to an enhanced red emission, under the AM 1.5 conditions (With a Solar Simulator having 6 inches diameter beam: 51.5607 $cm^2$ illuminated surface area) having an incident power density of 100 $mW/cm^2$ on the working plane, with and without the presence of Component1 over the "same" cSi solar cell.

The results demonstrate a net increase into the EQE of ~100% in the range of 350-370 nm when confronted with a cSi with no Component) deposited on top of it (on the same cell), with an enhancement of 2-5% into the PCE (non uniformity because of the Drop casting method used to deposit Component) over cSi PV cell).

Furthermore with the initial results onto the generation of CIGS like layered hydroxides, based on the empirical formula:

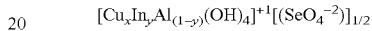

(abbreviated as CIAS) from group I-III-VI2 elements, intercalated by Selenium tetraoxide ($SeO_4^{2-}$) embodiments described herein provide a self-sustaining synthesis procedure which enables to realize CIGS replica layered materials, separated by an intercalating organic specie (which can also be of acceptor type) and act as bridges between different CIGS replica layers (Cu/Al deficient: p-type) or Indium rich (with $In^{3+}$ occupying the $Al^{3+}$ deficient site: thereby n-type); hence generating an array of p-n-p-n- . . . junction, not necessarily periodic, and therefore the discontinuity is deemed to behave as a demarcations in forming a cell in parallel.

Hence, in line with the success in developing lanthanide doped layered double hydroxide material, the hypothesis of creating CIGS-like and CIGS replica materials, following the innovative step-hydrothermal-like synthesis approach (see e.g. FIG. 4), is part of the present invention as an extension to the synthesized Component1.

BRIEF DESCRIPTION OF THE DRAWINGS

FIG. 3 shows embodiments according to the present disclosure of the some realized high band gap (CIGS-like) materials.

FIG. 5 provides a schematic view (Grey=C, Dark grey=O, Snow white=H) of the scavenging effect on •OH free radical by 3CCA⁻(left) to give 7OH3CCA⁻(right).

FIG. 6 provides a SEM micrograph (a) of 3CCA-Eu-HTLC taken over ITO conducting substrate via spin coating, showing the lamellar morphology together with EDAX map focussing on one of the agglomerates of 3CCA-Eu-HTLC-(b).

FIG. 7 provides a Pawley fit refinement of 3CCA-Eu-HTLC (a=b=3.044(2), c=17.410(8), space group "P6") (a), and 7OH3CCA-Eu-HTLC phase (with same cell parameters used for refinement) showing the broadened peaks of the degraded but still layered structure highlighted in red (b); extra peaks present at 2θ=17.3, 26.2 and 28.1° corresponds to free 7OH3CCA.

FIG. 8 provides GIXRD data showing the 3CCA-HTLC phase deposited onto ITO-coated PET in the angular range from 2 to 12 °2θ.

FIG. 9 shows a TGA/DTG of 3CCA-Eu-HTLC sample carried out from 50° C. to 1000° C. with ramp rate of 10° C/min. before (a) and after (b) interaction with •OH free radical solution, i.e 7OH3CCA-Eu-HTLC.

FIG. 32 (b) on the other hand describes schematically the possibility of having the PEC and/or Fuel cell combination, into the remaining half of the fiber based co-electrospun (or produced via similar spinning techniques.

DETAILED DESCRIPTION OF THE INVENTION

Figure 1:
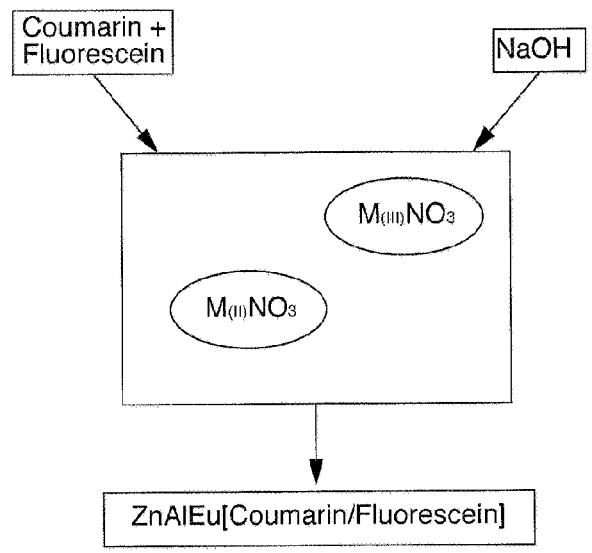
FIG. 1 schematically shows embodiments of the one-pot synthesis of hybrid composite nanomaterial(s), e.g. Component1, according to the present disclosure with the abbreviated chemical names of the organic molecules and that of the interacting precursors.

Reference will now be made in detail to the various embodiments of the invention, one or more examples of which are illustrated in the figures. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

The present invention can be achieved via self-assembly process, in which the lanthanide ion acts as carriers of the organic counterparts, thereby assembling them inside the layered galleries of the hydrotalcite like nanocomposite, in an simultaneous act of adjusting inside the 2D layer.

Embodiments described herein may provide preparing a hybrid layered double hydroxide like material having a distance between the individual layers of the layered double hydroxide of 2 nm and comprising of TWO organic anions (Molecule1; Molecule2) as charge-balancing anions; where e.g. Molecule1=Coumarin 3 carboxylic acid, $C_{10}H_6O_4$ Molecular Weight 190.15; (having $\lambda_{ex}$=370-390 nm, and corresponding $\lambda_{em}$=450 nm) while Molecule2=Fluorescein sodium salt, $C_{20}H_{10}Na_2O_5$ Molecular Weight 376.27: $\lambda_{ex}$=460 nm; $\lambda_{em}$=515 nm, with the intercalation process comprising the steps of:

(a) The unique one pot synthesis consisting of preparing a precursor solution suspension comprising of a divalent metal ion source(s) and a trivalent metal ion source(s); thereby thoroughly mixing at RT, with constant stirring, of the precursor solution in a polar solvent, e.g. milliQ water etc, with external maintenance of pH range (7.5-8) until an opaque slurry (brucite like structures) starts to form.

(b) The natural hydrothermal synthesis follows the step (a) (On subjecting the prepared solution to a high temperature and high pressure for a certain amount of time; high T, P, t); which is usually achieved in a sealed Teflon container kept in an oven.

(c) Wherein into the precursor suspension, obtained after step (a) exists a brucite like structure, having co-occurring/co-existing chelated counterparts of the Lanthanide ions (in its vacant co-ordination spheres, with 8-9 co-ordination bonds possible) with that of the anionic organic molecules (Molecule1; Molecule2) and/or water/default precursor anion.

The organic anion(s) can be added before the formation of metal hydroxides (brucite) like structures in step (a), so as to obtain a seed for the formation of a self-assembled layered double hydroxide's 2D layer inserted with the complexes of the lanthanide with that of Molecule1; Molecule2;

The divalent metal ion source(s) and/or the trivalent metal ion source(s) are put into the mixing process in a polar solvent before the step (b) at controlled pH;

Deionized water (or similar polar solvent) can be used as suspending medium, with the proviso that the TWO organic molecules are not the sole anionic components into the solution phase, as they co-exist with the precursor salts anion e.g. Nitrates, $H_2O$ molecules and externally induced $HSe^-$ (as per the case and object of the synthesis be), which have been generated as part of the invention, such that their presence in majority into the solution, acts as inter layer charge balancing and also to chelate the lanthanide ion among the Molecule1 and Molecule2, thereby fulfilling their empty co-ordination spheres, which couldn't have been achieved due to steric hindrance constraints from large organic molecules alone.

As the affinity of the Molecule1; Molecule2 with that of the lanthanide ion can be more due to chelate effect (from Molecule1 and Molecule2), thereby replacement of the majority default water molecules within its co-ordination sphere takes place as a default case under high temperature and pressure conditions. Following which the Lanthanide ion, chelated with Molecule1, Molecule2 can replace the octahedral site occupying, trivalent ion M(III) from the brucite like layered double hydroxides, thereby losing in the act, the still co-ordinated water molecules and fulfilling its co-ordination sphere, to an octahedral one, with continued chelation from the bidentate ligand(s), with that of the surrounding 2D layers' atoms (one of the example can be "O" of the $^-OH$ anions present into the solution).

The aim of preparing the hybrid layered lanthanide doped double hydroxide, hydrotalcite like materials is thereby successfully achieved following the synthesis process as detailed in this invention, and proven by the obtainment of a distance between the individual layers of the layered double hydroxide of ~2 nm, originating from the dual organic anions intercalation via the aforementioned self assembly and higher chelation affinity with the lanthanide ions when compared to the defaults (water molecule and precursor anions).

The synthesis procedure with experimental details, following the synthesis of hybrid lanthanide doped nano composite (e.g. the Component1) with theoretical empirical composition:

$$Zn(II)_{0.65}M(III)_{0.35}(OH)_2](Molecule1^-)_{0.175}(Molecule2^-)_{0.175}$$

(assuming 100% yield and 1:1 Molecule1:Molecule2 insertion as principle inter-layer anions), underlines the mixing of various precursor elements such as: $Zn(NO_3)_2.6H_2O$ (obtained from Sigma Aldrich with 98% purity and used without further purification), $Eu(NO_3)_3.6H_2O$ and $Al(NO_3)_3.9H_2O$ (both 98% purity).

Furthermore the desired anionic species, i.e. $3CCA^-$ anion and Fluorescein (see e.g. FIG. 1) were added in continuous stirring mode into the aforementioned salts solution. $Na^+3 CCA^-$ was formed separately, by reacting 3CCA (99% purity) and NaOH in equimolar ratio into the reaction flask containing 100 ml of milliQ water. Whereas for the synthesis of a modified form of Component1: called as Component1' which intercalates only the Molecule1 ($3CCA^-$ anion) within its layers, for a specific application as hydroxyl free radical scavenger ('OH) has also been synthesized in line with the above synthetic route, and is described in detail as Example 1.

Following the synthesis route, the organic-inorganic solution thus obtained was stirred for 3 hours at room temperature (RT) with drop-wise addition of a 1 molar aqueous solution of NaOH, until the pH of the reaction mixture solution was stabilized in the range of 7.5-8, a range found perfect in obtaining optimum crystallinity of the final layered product with M(II):M(III) ratio≈2:1.

An opaque suspension could be observed as the solution pH was neared to 7.5. This partially precipitating solution was then kept into a sealed autoclave until 12 hours at 80° C. after the mean pH was found to be stabilized at a value near to 8. The final solution mixture after the hydrothermal synthesis was filtered and washed with excess amount of milliQ water to eliminate the surplus ions and non intercalated anionic Molecule1 and Molecule2, thereby the final obtained material was dried in controlled atmosphere at c.a. 80 C to eliminate the water content.

For the synthesis of Component1, the divalent and trivalent metal ion sources generally can be salts of the divalent or trivalent metal ions. Examples of divalent metal ions can be: 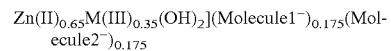, and $Mg^{2+}$, while examples of trivalent metal ions can be $Al^{3+}, Sm^{3+}, Eu^{3+}, Gd^{3+}, Cr^{3+}, Fe^{3+}, Co^{3+}, Mn^{3+}, Ni^{3+}, Ce^{3+}, In^{3+}$ and $Ga^{3+}$. By way of example, the present disclosure present the details of the ones underlined (but not excluding the possibility of other ions additions).

It is further contemplated to use three or more different metal ions in the layered double hydroxide prepared within the process of the invention. Of these metal ions the combination of $Zn^{2+}$ with that of ($Al^{3+}$, $Eu^{3+}$); ($Al^{3+}$, $Sm^{3+}$); ($Gd^{3+}$) has been proven according to embodiments described herein.

Thereby, the various materials synthesized and described herein, following the basic empirical formula as depicted below, are summarized into the attached FIG. 2:

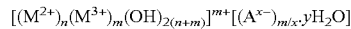

Figure 2:
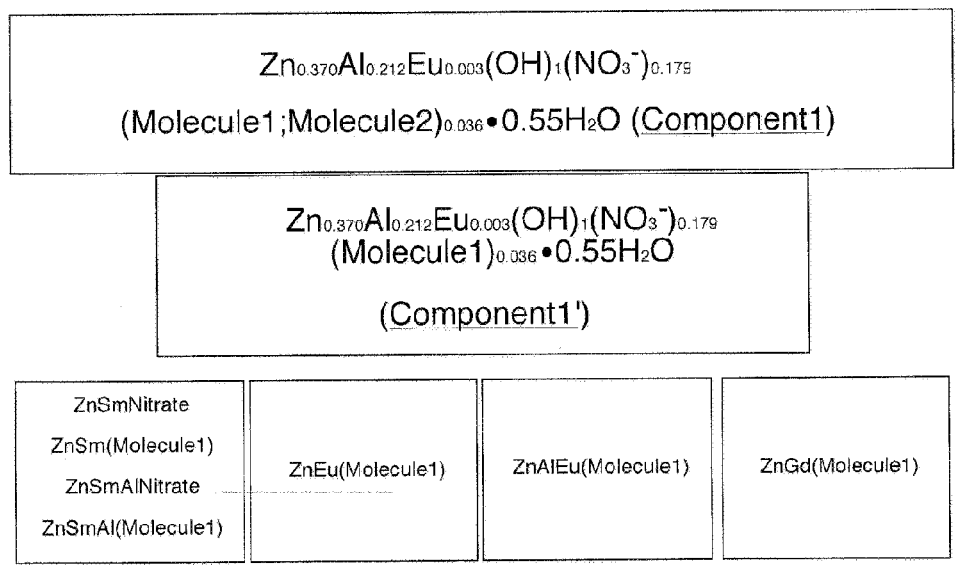
FIG. 2 shows various ZnAlEu (Molecule1; Molecule2) based layered double hydroxides synthesized according to embodiments of the present invention.

FIG. 2 shows various ZnAlEu(Molecule1;Molecule2) based layered double hydroxides synthesized according to embodiments of the present invention.

Thereby, continuing with the exemplifying description of Component1, its application into obtaining an efficient light energy down conversion material along with its full characterization has been provided.

Component1 was found having the nominal formula obtained from EDAX, TGA data analysis as:

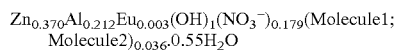

Balancing of the excess positive charge with that of anionic nitrates (starting metal salts anionic counterparts) is inevitable because of various factors, including the steric effect of the Molecule1; Molecule2 which permits anionic nitrates to co-intercalate and thereby balance the "remnant" positive charge, left unbalanced because of the steric effects in between the 2D layers, generated on the first place as a result of the charge imbalance originating from M(III) substituting M(II) ions.

The employed reactant amounts (precursors) were carefully chosen after preliminary experiments such that they give the maximum yield of inserted Eu, without the formation of an extra Eu phase and together with relevant amount of Molecule1 and Molecule2 intercalated into the HTLC.

The surplus precursor counter parts (Nitrates in the present exemplifying case) are also cointercalated together with the Molecule1;Molecule2 for charge balancing, thereby pointing towards the role of the lanthanide dopants as the only carriers of the organic molecules into the layered structures via self-assembly process during hydrothermal conditions (high T, P, t).

Combined with the aforementioned steric effects, which limits a full replacement of the default interlayer anions, even with the little co-intercalation of the organic molecules, the objectives of exploiting the energy down conversion "energy-hopping" effect (perceived with the emission of Molecule1 being close to the absorption of Molecule2; whose emission in turn is used to excite the Ln-ion via inter state coupling process), thereby working as efficient energy down conversion materials for the purposes of the present invention, has been well achieved.

Component1: 3CCA-Fluo-Eu-HTLC; in particular, can be described in detail as follows:
The synthesized material was characterized by XRPD, NMR and TGA techniques, while to confirm the retaining of lamellar morphology pertaining to the layered double hydroxide, on being deposited via techniques like spin coating on a standard device structure: PET/ITO/PEDOT:PSS (see e.g. FIG. 6a in relation to Example 1), has been confirmed with Grazing incidence X-Ray diffraction (GIXRD) and SEM microscopy techniques.

EDAX quantitative analysis of major Zn, Al and Eu atoms was carried out, and a $Zn^{2+}/Al^{3+}+Eu^{3+}$) ratio of 1.72 was measured. The obtained $Eu^{3+}/Al^{3+}$ atomic ratio on the other hand resulted to be 1.3%. More precisely, XRD measurement analysis confirmed the intercalation of 3CCA/Fluo into HTLC in both powder (see e.g. FIG. 7a in relation to Example 1) and spin-coated sample (see e.g. FIG. 8 in relation to Example 1), as indicated by the typical [001] at 2θ=4.4° corresponding to a d-spacing of ~2.0 nm.

The solid state luminescence spectra of Eu-containing hydrotalcites are reported concentrating on the 400-700 nm emission band range, with a corresponding excitation in the 310-370 nm wavelengths range. For comparison, the luminescence spectra of Eu-free 3CCA-HTLC can be found in "*Synthesis and* characterization of host-guest materials obtained by inserting coumarin into hydrotalcite layers for LED applications, Physica Status Solidi (A), 2009, 206(9), 2171-2176. Sumeet Kumar, Marco Milanesio, Leonardo Marchese, Enrico Boccaleri".

Figure 18:
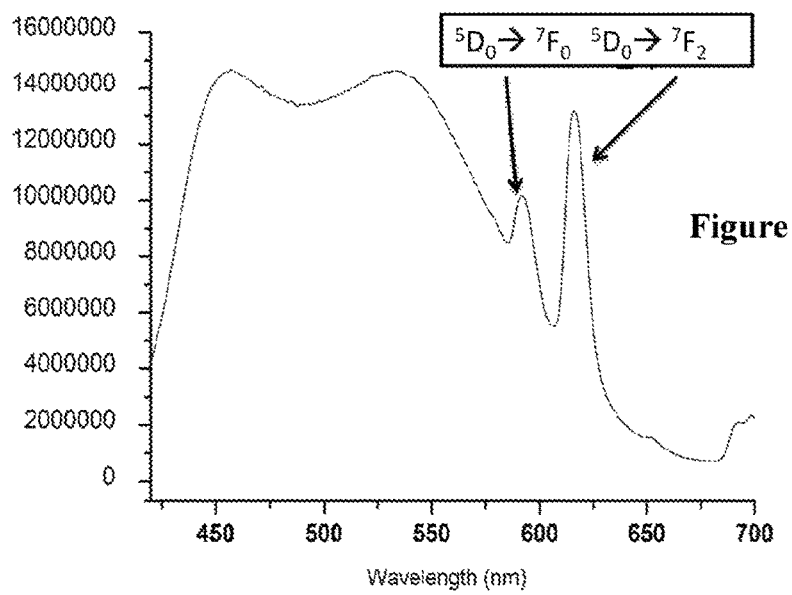
FIG. 18 shows that the energy of the 5D0→7F0 transition is usually related to the so called nephelauxetic effect induced by the ion's first neighbors (3CCA in particular) it is proposed that in the ZnAlEuCoumarin LDH (Component1'), the Eu3+ ions possibly occupy the interstitial sites with a lower local symmetry.
Figure 19:
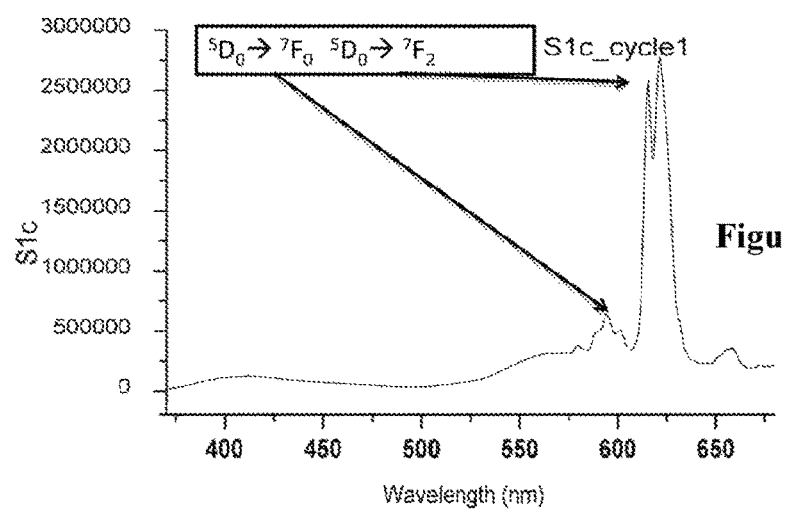
FIG. 19 shows the SS-PL of Component1, in which inter molecular energy transfer between Coumarin and Fluorescein molecular pairs can be clearly seen with an explicit increase into Europium's Red emission.

The luminescence spectra of both Component1 (3CCA-Fluo-Eu-HTLC) and Component1 (3CCA-Eu-HTLC, synthesized for comparison and proof of the energy down conversion phenomena) shows narrow emission bands of $Eu^{3+}$ at 579, 590, 614, 649 and 692 nm which corresponds to the $^5D_0 \rightarrow ^7F_J$ (J=0, 1, 2, 3, 4) transitions, with a modification of the luminescence properties and enhancement in the 614 nm region, where Eu-free 3CCA-HTLC does not show any signal, see e.g. FIGS. 18-19 in relation to Example 2.

The radiative transitions within the [Xe]4f6 configuration of $Eu^{3+}$ are parity forbidden and consist mainly of weak magnetic dipole and induced electric dipole (ED) transitions.

By observing FIGS. 11a and 11b in relation to Example 1, it descends that the emission bands of $Eu^{3+}$ remain narrow even at an inorganic (HTLC)/organic interface due to the fact that the partially filled 4f orbitals are shielded from the environment by the filled 5s and 5p orbitals.

Since the $^7F_0$ state is non-degenerate, the $^5D_0 \rightarrow ^7F_0$ emission band doesn't exhibit ligand field splitting in 3CCA-Eu-HTLC and 3CCA-Fluo-Eu-HTLC. The single peaks at 579 nm in the emission spectra of FIGS. 11a and 11b in relation to Example 1, therefore indicate that there is only one luminescent $Eu^{3+}$ species in the hybrid nano-composite for each organic-inorganic interaction. However, the $^5D_0 \rightarrow ^7F_1$ emission around 590 nm is a pure magnetic dipole transition (evident only in the case of 3CCA-Fluo-Eu-HTLC, FIG. 11b in relation to Example 1).

Wherein, the strongest emission is observed at around 614 nm corresponding to the $^5D_0 \rightarrow ^7F_2$ transition, and pumped by the two molecules through inter-state coupling (ISC) phenomena, thereby the emission of Molecule1 (Coumarin alone) is suppressed while sole europium red emission (at 614 nm) is observed (see e.g. FIG. 19 in relation to Example 2).

As the intensities of some electric dipole transitions are extremely sensitive to the nature and symmetry of the coordinating environment, $^5D_0 \rightarrow ^7F_2$, transition is an example of such a hypersensitive transition. The emission spectra of the final sample, clearly shows the splitting of $^5D_0 \rightarrow ^7F_1$ (579 nm) and the $^5D_0 \rightarrow ^7F_2$ (614 nm) emission bands caused by the ligand field effect, with a change of Eu environment due to 3CCA-Fluo chelation.

Figure 20:
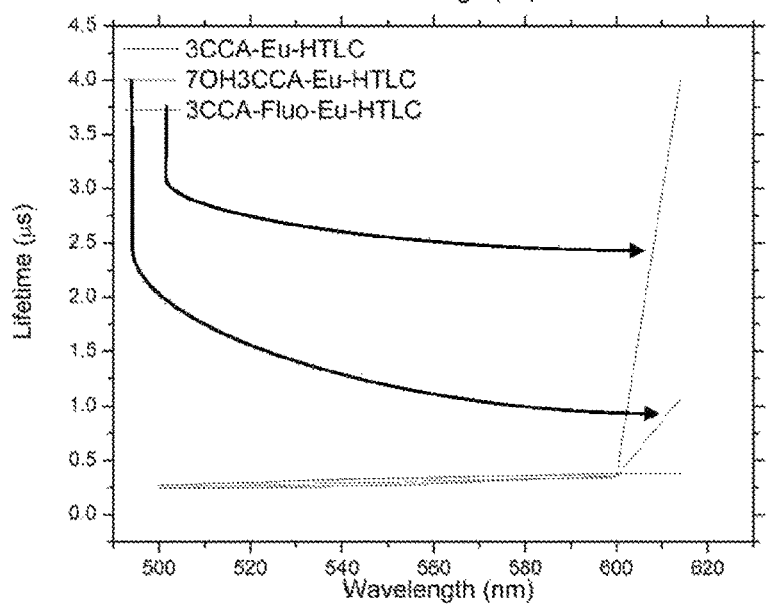
FIG. 20 shows a Luminescent Lifetime comparison of Component1, Component1' and of its free radical exposed product Component1'-7OH.
Figure 21A:
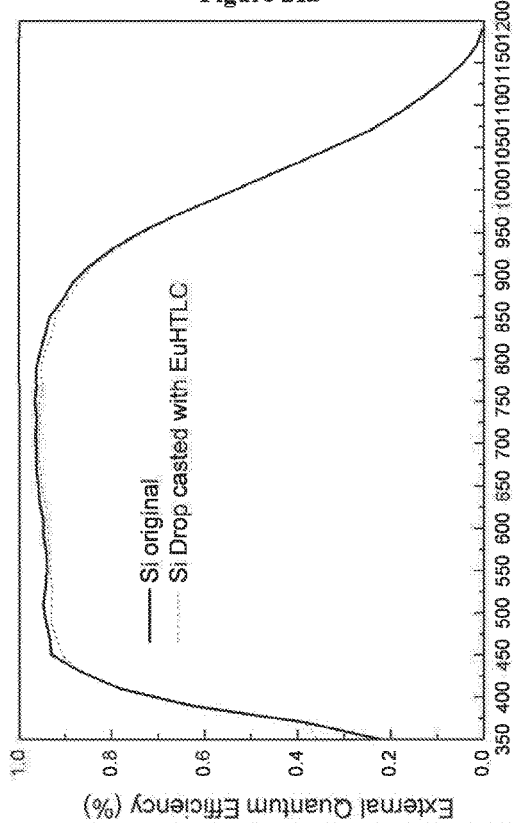
FIG. 21 provides the test on cSi under AM 1.5 conditions.
Figure 21B:
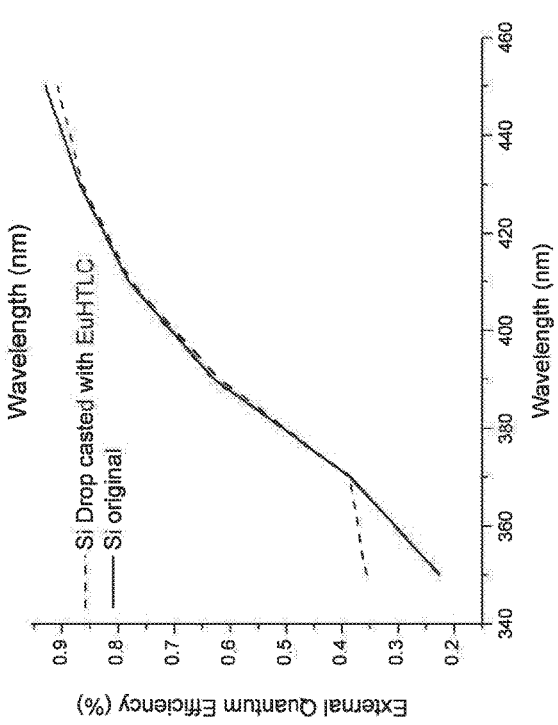
Figure 21C:
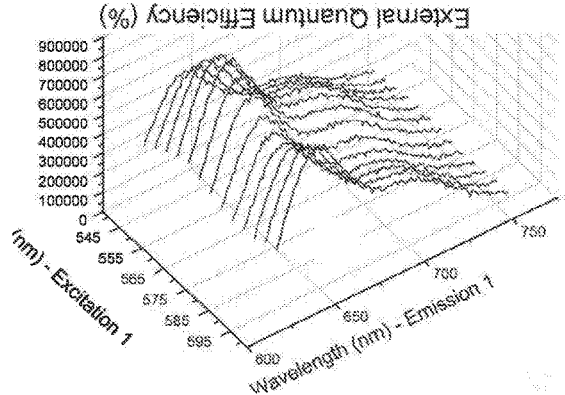
Figure 21D:
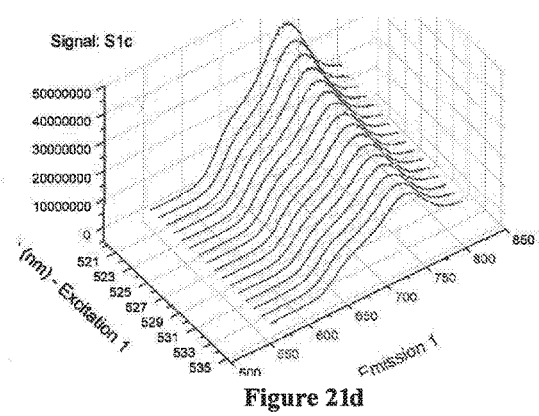

Considering the luminescence lifetimes, the Component) (3CCA-Fluo-Eu-HTLC) gives rise to a lifetime of above 4 μs, which is ~10 times higher with respect to 3CCA-Eu-HTLC (observed experimental lifetime of 0.34 μs) measured at an emission wavelength of 614 nm corresponding to the $^5D_0 \rightarrow ^7F_2$ transition (see e.g. FIG. 20 in relation to Example 2).

It is possible to relate the luminescence lifetimes to the energy gap between the triplet state of the ligand and the acceptor level of the metal ion, hence it can be deduced, that the shorter luminescence lifetime of 3CCA-Eu-HTLC suggests that the energy gap, between the 3CCA$^-$ ligand triplet state and the $^5D_0$ state of $Eu^{3+}$, is smaller than that in the case of 3CCA-Fluo-Eu-HTLC (where energy levels are generated with the presence of the degenerated LUMO levels born out of the two organic chelates).

Whereas, in context of the realization of $CuIn_xGa_{(1-x)}Se_2$ (CIGS) like layered materials, the present disclosure provide using the precursors salts out of: $Cu^{2+}$ and mixed in stoichiometric ratios with $In^{3+}$, $Al^{3-}$ and $Fe^{3+}$ in a Selenium tetraoxide anionic environment (src. Selenic acid), such that $SeO_4^{2-}$ can intercalate the layered structure generated by the ($Cu^{2+}$ with $In^{3+}$, $Al^{3-}$ and $Fe^3$) precursor ions; see e.g. FIG. 3, and also serve as Selenium source (directly or indirectly when induced with externally bubbled gas, i.e. $SO_2$).

FIG. 3 shows embodiments according to the present disclosure of the some realized high band gap (CIGS-like) materials:

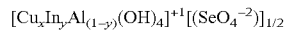

(CIAS) involving Cu, In, Fe, Al and $SeO_4^{2-}$; while possibility to arrive at a CIGS-like layered material via $SeO_4^{-2}$ intercalation and $HSe^-$ generation, thereby boycotting the hydroxyl ions from the reaction system:

  (p-type; Indium deficient); and

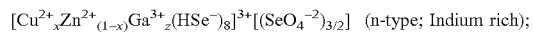  (n-type; Indium rich);

Following with the synthesis of CIGS replica, from the intermediate structure and intervention of Indium ions into the reaction mixture together with $SO_2$/Ammonia/HCl gas during a multi-step high P,T,t conditions realizing the intermediate:

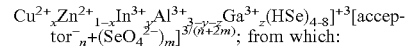; from which:

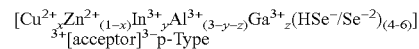

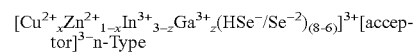

can be generated as an extended part of the invention.

Figure 4:
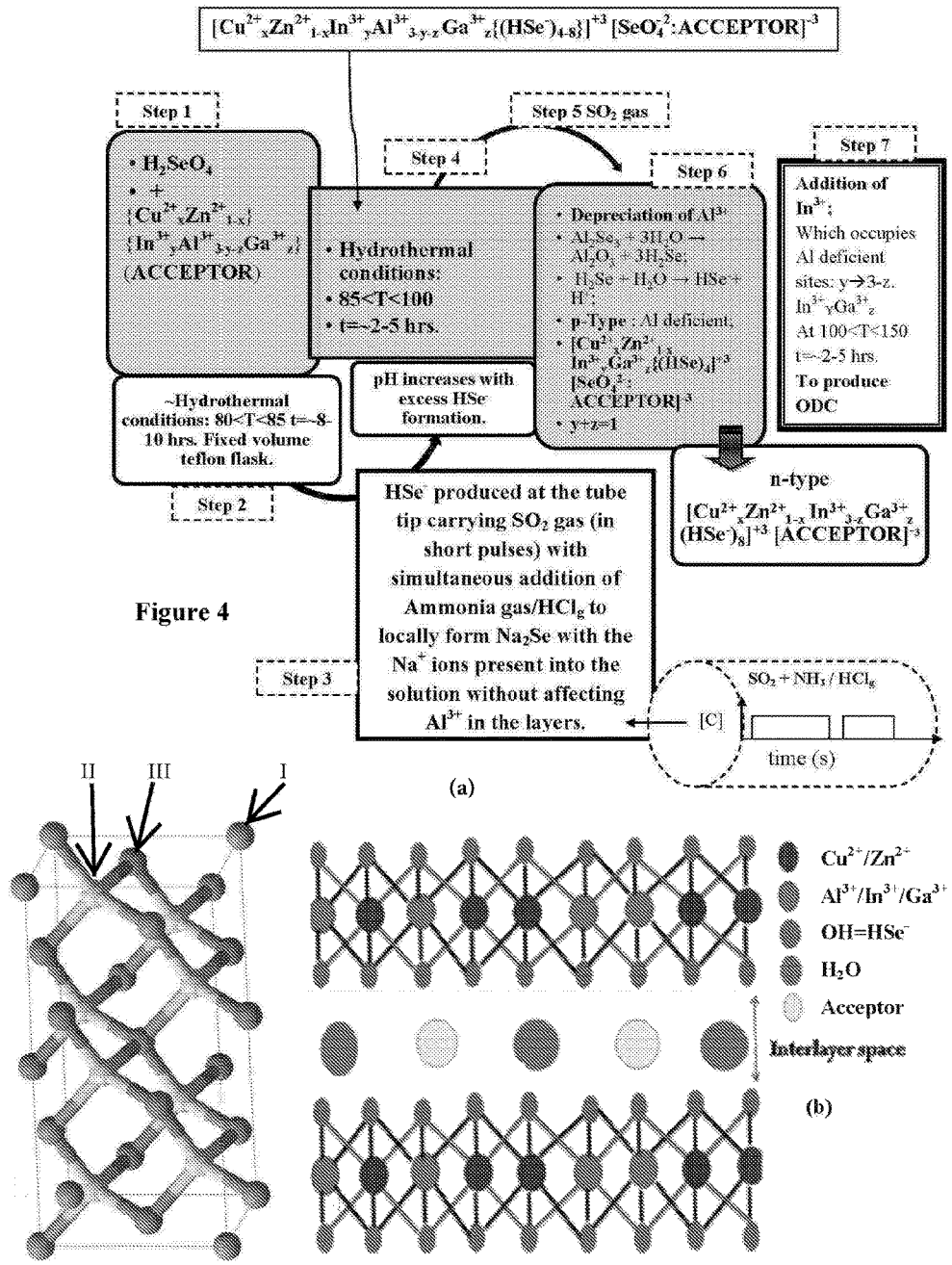
FIG. 4 shows schematics of p-n type CIGS replica formation utilizing the standard quasi hydrothermal reaction conditions into an excess of HSe-/Se2- environment, with the standard unit cell of CIGS Grey (denoted by I)=Cu, Light Grey (denoted by II)=Se, Dark Grey (denoted by III)=In/Ga shown in (a) while a typical Layered double hydroxide with intercalating anions is shown in (b).

Moreover, the fact that Se has already been proven in forming cage like structures, is a further support to the hypothesis in forming layered octahedral sheets out of Cu—Zn, In—Al—Ga, and (Se ions produced in situ according to the scheme shown e.g. in FIG. 4).

Example of suitable zinc sources, employed into the synthesis, includes but not limits to nitrate salts of Zinc. While the Aluminium and Europium sources typically are also a salts (preferably, but not limited to, the same anionic component like that of zinc i.e. Nitrate in the present example case).

Figure 29:
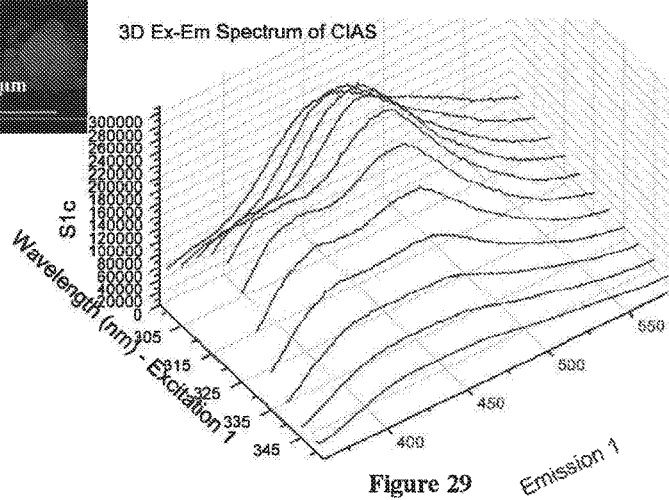
FIG. 29 provides 3D excitation and emission spectra of [CuxInyAl(1-y)(OH)4]+1[(SeO4-2)]1/2 (CIAS) from group I-III-VI2, which show a decrease in emission intensity at Near UV (350 nm) excitation, thereby pointing towards it being a high band gap transparent material.

Whereas precursors, not limiting to Copper(II) chloride, Indium(III) chloride, Al(III) chloride and Iron (III) chloride were used for the generation of CIGS-like materials with code names CIAS for $[CuIn_yAl_{(1-y)}(OH)_4]^{+1}[(SeO_4^{-2})]_{1/2}$ (in an attempt to conduct the initial study of the feasibility in obtaining CIGS like low band gap absorber material from groups I-III-VI2), see e.g. FIG. 29 in relation to Example 3.

Whereas attempt to have magnetic material with the presence of paramagnetic Fe ion, $[Cu_xIn_yFe_{(1-y)}(OH)_4]^{+1}[(SeO_4^{-2})]_{1/2}$, CIFS (from group I-III-VIII elements) along with the full list of combinations resulting into nano composite materials, as possible paramagnetic materials, is also shown as part of the following Table 1.

TABLE 1

Chart showing the synthesized nano composites along with the possible combinations in case of synthesizing the CIGS like and replica type absorbing materials.

| Element | Combinations | CIGS like | Fully Reduced CIGS like |
|---|---|---|---|
| Cu | ✓ | ✓ $[Cu^{2+}_xZn^{2+}_{(1-x)}In^{3+}_yAl^{3+}_{(1-y-z)}Ga^{3+}_z(OH)_4]^{+1}$ $[(SeO_4^{-2})_{\delta/2}$ $(Acceptor^-)_{(1-\delta)}]$ $0 < x <= 1; 0 < y + z < 1;$ $y, z > 0; 0 < \delta <= 1.$ CIGS like hydroxides' in which the Se source is left intercalating with the positive charges of the HTLC interlayer, together with a possibility of co-intercalating with anionic PCBM's derivative. | ✓$Cu^{2+}_xZn^{2+}_{(1-x)}In^{3+}_yGa^{3+}_z(OH)_4]^{+1}$ $[(HSe^-)_\delta (Acceptor^-)_{(1-\delta)}]$ $0 < x <= 1; 0 < y + z < 1; y, z > 0;$ $0 < \delta <= 1$ $Al^{3+}$ deficient layer; p-type material. ✓With re-addition of $In^{3+}$ (to occupy the interstitial Al defects); under high T, Pressure conditions; possibility to get n-type material. |
| In | ✓ | ✓$[Cu^{2+}_xZn^{2+}_{(1-x)}In^{3+}_yGa^{3+}_z(HSe^-)_4]^{3+}$ $[(SeO_4^{-2})_{3/2}]; y + z = 1;$ Indium deficient; ✓p-type ✓Instead of Hydroxyl anions, the HTLC synthesis is carried out in an Aqueous Selenic acid solution; bubbled with $SO_2$, to reduce it to elemental Se. ✓In the presence of 2D layer's $Al^{3+}$ ions, the formation of $Al_2Se_3$ occurs with local production of $H_2Se$, which immediately gets ionized to $HSe^-$. ✓This $HSe^-$ is perceived to form hydroxides like bonds with similar octahedral coordinations like that of $^-OH$ anions. | ✓$[Cu^{2+}_xZn^{2+}_{(1-x)}In^{3+}_{3-z}Ga^{3+}_z(HSe^-)_8]^{3+}[(HSe^-)_{3/2}];$ Indium rich; ✓n-Type. ✓$[Cu^{2+}_xZn^{2+}_{(1-x)}In^{3+}_{3-z}Ga^{3+}_z(HSe^-)_8]^{3+}[(Se^{2-})_{3/2}]$ |

TABLE 1-continued

Chart showing the synthesized nano composites along with the possible combinations in case of synthesizing the CIGS like and replica type absorbing materials.

| Element | Combinations | CIGS like | Fully Reduced CIGS like |
|---|---|---|---|
| Ga | ✓ | | |
| acceptor | ✓ | | ✓ $[Cu^{2+}{}_x Zn^{2+}{}_{(1-x)} In^{3+}{}_y Al^{3+}{}_{(3-y-z)} Ga^{3+}{}_z (HSe^-)_{4-\delta}]^{+1}$ $[Acceptor]^{-1}$ $0 < x < 1; 1 <= (y + z) <= 3$ |
| Al | ✓ | ➢ | ➢ ZnAlNitrate, ZnAl(Molecule1), ✓ $[Cu_x In_y Al_{(1-y)}(OH)_4]^{+1} [(SeO_4^{-2})]_{1/2}$ (CIAS) |
| Fe | | | $[Cu_x In_y Fe_{(1-y)}(OH)_4]^{+1}[(SeO_4^{-2})]_{1/2}$ (CIFS: Magnetic materials) |
| Zn | ✓ | ➢ | Under hydrothermal conditions Zn present into the layers has been found in experiments carried out by the inventor to form, in part, ZnO integrated phase (grown on the 2D layer itself). See XRD peaks at $31 < 2\theta < 37$ deg. |
| Sm | | ➢ | ➢ ZnSmNitrate; ZnSmAl(Molecule1), ZnSm(Moelcule1). |
| Eu | | ➢ | ➢ $Zn_{0.370}Al_{0.212}Eu_{0.003}(OH)_1(NO_3^-)_{0.179}$ (Molecule1; Molecule2)$_{0.036}$•0.55$H_2O$ (Component1) ➢ $Zn_{0.370}Al_{0.212}Eu_{0.003}(OH)_1(NO_3^-)_{0.179}$ (Molecule1)$_{0.036}$•0.55 $H_2O$ (Component1') |
| Gd | | ➢ | ➢ ZnGd(Moelcule1) |
| $SeO_4^{-2}$ | ✓ | | |
| Coumarin (Molecule1) | | ➢ | |
| Fluorescein (Molecule2) | ➢ | | |

Thereby in line with the present invention and with the initial attempts into creating a CIGS-like (CIAS) material $[Cu^{2+}In^{3+}{}_x Al_{(1-x)}(OH)_4]^{+1}$ $[(SeO_4^{-2})_{1/2}]$, embodiments described herein provide novel synthesis route aiming at the preparation of CIGS replica like compact solar materials following the similar approach of hydrothermal synthesis with an option to control the M(II) and M(III) rapport by:
a) Choice of M(II)'s e.g. $Cu^{2+}$ doped with $Zn^{2+}$ ions, and
b) With induced reduction of $SeO_4^{-2}$ generating elemental Se, which with its high reactivity, can engulf the electropositive ions (e.g. $Al^{3+}$ from the layer) and $Na^+$ already present in the solution, thereby rendering us with the possibility to have Cu deficient p-type-α phase (owing to in situ ZnO extra phase formation as already observed into the Component1 synthesis having extra ZnO phases):

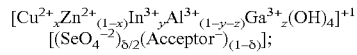

Where $0<x<=1; 0<y+z<1; y, z>0; 0<\delta<=1$; When $y+z\approx1$, the little Al is consumed (leaving behind a vacancy/deficiency equivalent to rendering the material p-type) via formation of $Al_2Se_3$ with the elemental Selenium (Se) produced on $SO_2$ bubbling into the solution mixture. The $Al_2Se_3$, thus formed, hydrolyses to form alumina, and $H_2Se$ which immediately ionizes due to the presence of a liquid phase. Hence the presence of Zn and Al is to provide not only p-type character to the final product, when they are removed under externally induced gases at high T, P conditions, leaving the sites vacant, but also to have a possibility to generate in situ Al doped:ZnO as transparent conducting cathode materials into the vicinity of the CIGS like layered phase.
The final expected CIGS-like compound (in the presence of $^-OH$ anions) can be engraved to have an empirical formula:

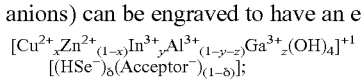

OR $[Cu^{2+}{}_x Zn^{2+}{}_{(1-x)} In^{3+}{}_y Al^{3+}{}_{(1-y-z)} Ga^{3+}{}_z (OH)_4]^{+1} [(Se^{2-})_{\delta/2}$ $(Acceptor^-)_{(1-\delta)}]$; depending on the extent of the ionization of in situ generated $H_2Se$ gas with the water content into the solution.

Furthermore embodiments described herein provide a synthesis method, based on an approach similar to hydrothermal route, aiming at the production of CIGS replica nanocomposites, wherein routes can be defined, as an extension to the basic synthesis procedures, in synthesizing the α-phase: p-type $Cu(In,Ga)Se_2$, which has Cu/Al deficiency induced by $Zn^{2+}$ and $Al^{3+}$ consumption, rendering the synthesized material with a majority carrier concentration (hole) by increasing the number of Cu/Al vacancies. Noteworthy is that, these vacancies can behave as electron acceptors, thereby resulting into the p-type phase structure.

Moreover, when CIGS replica films are In rich (Cu deficient), formation of a Ordered defect compound (ODC) phase: n-type $Cu(In,Ga)_3Se_3$ takes place;
Thereby, it is proposed that during the synthesis step(s), re-addition of $In^{3+}$ ions (from Indium precursor) can render the material In-rich, hence giving a possibility to the $(In^{3+})$ ions to migrate and occupy the Al deficiency sites from the solution phase under the multi step high T, P conditions, see the full scheme in FIG. 4.

Thus, a similar to present CIGS industry demand ideal ratio for Ga:(In+Ga)≈0.7 can also be perceived. However, as at Ga:(In+Ga) ratios above ~0.3, the present CIGS device performance drops off. The industry currently targets the 0.3 ratio, resulting in bandgaps between 1.1 and 1.2 eV. Noteworthy is that the decreased performance has been postulated to be a result of CIGS not forming the ODC, which is necessary for a good interfacing with CdS (state of the art electron transfer layer in CIGS field).

Thereby, in line with the one pot synthesis and formation of lanthanide doped layered double hydroxides, it comes within the spirit of the present disclosure a novel idea of synthesizing CIGS (replica) nanocomposites, following with initial successes, although resulting into a high band gap material instead of the normally expected low band gap absorber materials, ideal for maximum light absorption, see e.g. FIG. 29 in relation to Example 3, in synthesizing CIGS-like hydroxide materials (CIAS) at a low cost (one pot), via environment friendly and less hazardous scheme, than involved into the current CIGS manufacturing processes, following the solution phase synthesis in the presence of Cu, (Al, In, Ga) cations and a basic environment (provided by HSe⁻, with Selenic acid as the major source in the aqueous solution).

To underline the in situ production of elemental Se, from the bulk Selenic acid, present into the reaction mixture, which can be safely presumed to reduce to elemental Se on passing the SO₂ gas bubbles (or by providing Na⁺ ions along with SO₂/Ammonia/HCl gas through a single nozzle into the synthesis flask at controlled pressure); wherein the produced HSe⁻, can participate into its octahedral bonding with the M(II) and M(III) ions present into the layered structure as summarized.

With the aim to get quasi lamellar double hydroxide as shown e.g. FIGS. 3 and 4, the solution containing Selenic acid salt solution is subjected to SO₂ bubbles (with simultaneous increase of reaction temperature and pressure to ones normally needed to form the layered structure). Thereby, SO₂ reduces the SeO₄²⁻ to elemental Se, this elemental Se in turn reacts immediately with the electropositive element(s) in its vicinity (e.g. Al, Na); the Al₂Se₃ and/or Na₂Se thereby formed, (as a consequence of which the 2D layers is left Al deficient, while the bulk is rich in HSe⁻ ions; hence further addition of In ions is perceived to occupy the Al deficient sites), reacts in turn with the interlayer H₂O molecules to form H₂Se (yield is aluminium dependent) and as the process happens in solution phase, the H₂Se ionizes immediately to (HSe⁻), this anionic Se, thereby produced, apart from contributing into increasing the pH of the solution to above 7, can compensate with the layer to form substitution hydroxyl anions (thanks to its bonding flexibility), thereby bonding with the 2D layers to render them as CIGS replica compound semiconductor materials:

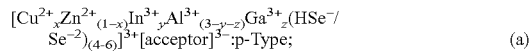

(a)

When no re-addition of In³⁺ is done; and y+z=1 from the predefined rapport precursor ions (and no trace of ⁻OH into the synthesis procedure); whereby only major anionic specie (i.e. HSe⁻/Se²⁻) is the reduction of SeO₄²⁻ to elemental Se from SO₂ bubbled into the solution, with maximum HSe⁻ formation depending onto the amount of Al present into the layered structure and governed by: 2Al+3Se→Al₂Se₃.

Thereby presence/addition of Na⁺ ions into the solution; can render the formation of Na₂Se in controlled bulk quantity (with similar characteristics and role as that of Al₂Se₃); as described ahead:

The formation of Na₂Se can be controlled by the bubbling of ammonia gas (probably pulses of which). Na₂Se thus, formed in controlled amounts, can substitute the Al deficient sites with the In(HSe)₆ as per the following possible reactions:

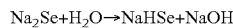

while in the presence of an acidic solution, the reaction producing H₂Se occurs: Na₂Se+2 HCl→H₂Se+2 NaCl; thereby reproducing the NaCl starting salt. The ionization of H₂Se can be assisted by the H₂O molecules (inter layer and that from bulk) and thereby guarantee an "excess" amount of ionized HSe⁻, to bond with the In³⁺ ions by occupying its 6 empty coordination spheres.

While with the re-addition of In³⁺ ions; one can perceive the formation of:

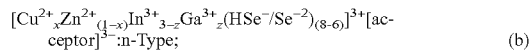

(b)

The synthesized materials (p-n type) can be characterized for the impurity extra-phase (Al₂Se₃/In₂Se₃) analysis in line with the work conducted in 1980.

According to aspects, the formation of CIGS like and CIGS replica (n-p Type materials) is provided, with the provision that in the presence of highly electropositive metals, such as Aluminium/Sodium and with the in situ formation of elemental Selenium (Se) taking place on bubbling SO₂ to the Selenic acid rich precursor solution, formation of Al₂Se₃ and Na₂Se can take place; Which are on the other hand strongly prone to hydrolysis, thereby forming the HSe⁻ (a replacement of ⁻OH, normally used to form the layered double "hydroxides").

Post intercalation route is also discussed such that: With the possibility to form elemental Se out of the intercalated SeO₄⁻², as One of the major charge balancing species in between the positively charged layers formed out of Cu/Zn—Al—In—Ga, on bubbling the reaction mixture with Sulfur dioxide gas (reduction step) thereby the elemental Se formed inside the galleries, can with its strong affinity with the Aluminium atom inserted into the 2D layer structure (occupying the octahedral site), can lead to the formation of Al₂Se₃ which can react with the interlayer H₂O molecules to form alumina and H₂Se (all in situ) leading to a Al³⁺ void.

Thus, this post synthesis process brings us back to the standard gas H₂Se used for selenization in a normal CIGS generation process, but with an added advantage of forming it in situ one pot and moreover inside the layered galleries where in the presence of water it ionizes to HSe⁻, thereby remaining into liquid phase (therein less hazardous).

It is noteworthy that the deficit into the local production of HSe⁻ ions (Aluminium dependent) can be compensated for, by the presence of Sodium ions (Na⁺) into the bulk solution, which immediately forms the hydrolysis prone Na₂Se and take forward the production of HSe⁻ insitu. Thereby the relevant reactions of the proposed invention can be:

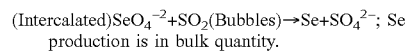

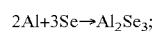

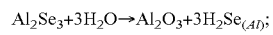

Where the only Al source is from the 2D layered nanocomposite structure, and thus this part of H₂Se is Al dependent.

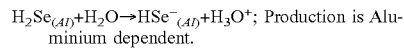

To overcome this Aluminium dependency; Sodium ions present into the solution can come to a rescue, which reacts (in the presence of ammonia bubbling/in pulses of varied time lengths) with the bulk (Se) formed from the presence in excess of H₂SeO₄ into the solution mixture, to form Na₂Se and the formation of excess HSe⁻ is therefore guaranteed.

Thus, the relevant supporting reaction of the invention can be:

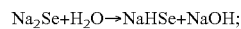

As per the necessity, in case NaOH production apart from destabilizing the pH of the solution, hinders the final objective of HSe⁻ insertion aimed at total boycott of ⁻OH ions (replaced by ⁻SeH) into the reaction mixture, one can follow the synthesis route with an addition of external HCl vapors along with ammonia/SO₂ gas mixtures; such that on formation of Na₂Se at the ammonia tip (by Sodium ions present into the solution); on coming in contact with a parallel flowing gas: SO₂; they find in their immediate vicinity $HCl_{(g \to aq)}$ with the ominous presence of water molecules to form $H_2Se$ following the reaction: $Na_2Se + 2\,HCl \to H_2Se + 2\,NaCl$; Hence the consumed $Na^+$ ions is reformed into the solution and are ready for readjusting the brucite like layers with the insertion of $HSe^-$.

The ionization takes place as before, with the only difference in it being $Na^+$ dependent:

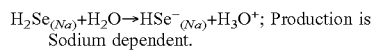

$H_2Se_{(Na)} + H_2O \to HSe^-_{(Na)} + H_3O^+$; Production is Sodium dependent.

According to this aspect, due to the strong affinity of elemental Se with electropositive metal, i.e. Al present into the 2D layer, even the elemental Se produced from non-intercalated $SeO_4^{-2}$ into the bulk solution can be sucked inside the layered gallery, where it is reduced to $HSe^-$ into the solution phase; thereby a depreciation of Al is deemed as inevitable.

The $Al_2Se_3/Na_2Se$ hence formed into the vicinity of Al atoms inside the 2D brucite like layer and in the bulk respectively, has the possibility to react with the inter layer co-ordinated water molecules/bulk water to form $H_2Se_{(g)}/HSe^-$ respectively, thereby dehydrating the CIGS like material (good for charge transfer).

Furthermore, having the Sodium ions as part of the synthesis, the beneficial effects of having Sodium ions (from 0.1 at % onwards; as per the state of the art info in CIGS field) into the hydrothermal synthesis procedure also includes an increase in p-type conductivity, texture, and average grain size. Furthermore, it is envisaged that the Na incorporation allows for CIGS performances to be maintained over larger stoichiometric deviations. Moreover it has been found that Na on Indium site creates a shallow acceptor level and that Na serves to remove In on Cu defects (donors). Na is also credited with catalyzing oxygen absorption in which Oxygen passivates Se vacancies which act as compensating donors and recombination centers.

The use of $SeO_4^{-2}$ as one of the intercalating anion may also be assisted by the commonly used (acceptor) fullerene anionic derivatives (e.g. chemically modified phenyl-$C_n$-butyric-acid-methyl-ester fullerene derivatives, or $[C_n]$ PCBM, etc.), with its purpose of acting as p-type intercalating acceptor material (together with tailor made Cu/Al deficient nano composite to render it a p-character) formed under the high (T, P, t) conditions.

Hence an empirical structure: $Cu^{2+}_x Zn^{2+}_{(1-x)} In^{3+}_y Al^{3+}_{(3-y-z)} Ga^{3+}_z \{HSe^-_{4-8}\}^{3+}(acceptor^{3-})$, via a similar to hydrothermal route already employed to co-insert Ln and organic molecule(s), can be foreseen to achieve by working into an ambient of $SeO_4^{-2}$ based polar solvent for the synthesis of an ordered defect compound (ODC: n-type) on adding controlled amount of In salt into the obtained solution, thereby resubmitting to a high (T, P, t) conditions as described into the scheme of FIG. 4. The ODC hence produced, can interface well with the CdS window on one hand while can also form a n-p-n-p . . . array with the un-modified pure α-phase (as left over phase which couldn't get its Al-deficient sites, fulfilled by the second phase of hydrothermal like synthesis with extra Indium added to occupy the Al deficient sites, to form an ordered defect structure).

Thus, with the help of the proposed synthesis schemes, procedure for the solution phase production of low cost CIGS like material is provided according to embodiments described herein and is summarized e.g. in FIG. 4, which shows schematics of p-n type CIGS replica formation utilizing the standard quasi hydrothermal reaction conditions into an excess of $HSe^-/Se^{2-}$ environment, with the standard unit cell of CIGS Grey (denoted by I)=Cu, Light Grey (denoted by II)=Se, Dark Grey (denoted by III)=In/Ga shown in (a) while a typical Layered double hydroxide with intercalating anions is shown in (b).

According to embodiments, the synthesized material ZnAlEuCoumarin:Fluorescein, called as Component1, can be formed of a hybrid material (i.e. a mixture of organic material "guest" and inorganic "host") structured such that the guest molecule(s) preserve their property of solar energy down conversion from UV to visible. The two organic molecules (Coumarin and Fluorescein in specific) are intercalated in solution phase, inside the host structure (which on the other hand comprises of Zn, Al and Eu atoms) due to the layered structure attaining a net positive charge because of charge imbalance (choice of M(II) and M(III) precursor stoichiometry). Component1's down conversion property from UV to Visible remains protected within this inorganic host until ~300-350 degree Celsius (thus their application at high temperature conditions, e.g. into concentration solar cell is also a possibility), and moreover it retains a good transparency towards light in the visible spectrum plus numerous other advantages.

The intercalation of the anionic organic molecules occurs via a process of self-assembly under high temperature and pressure conditions necessary for replacing the default metal salt anions (e.g. Nitrates). The successful intercalation has been principally characterized via principle techniques like: XRD/NMR/FTIR/TGA.

The Component1 has been tested on cSi based solar cell via depositing the same following a simple method of drop casting a solution with the dispersions of Component1 into a highly volatile solvent. An increase in the external quantum efficiency (EQE) was measured under the AM 1.5 conditions over a reference cell having an active area of c.a. 1 $cm^2$, with and without the Component1 above the cSi solar cell.

The results demonstrate a net increase into the EQE of ~100% in the range of 350-370 nm (UV) when confronted with a cSi with no Component deposited on top of it (on the same cell).

Embodiments described herein may overcome drawbacks of the current OPV technology, such as not efficient Absorption, not enough charge separation and not enough charge transport.

As far as light absorption is concerned, the effect of Component1 over cSi Solar cells (which are normally found to have an PCE of MAX~22% at laboratory scale) is explored, and it has been proven with success that, the increase in EQE, in the UV region, with the utilization of the Component1 as a light energy down conversion material is (~100%) with an increment of the existing PCE by (2 to 5) %, probably because of the uneven distribution of Component1 over the active cSi area, occurring due to drop casting method utilized. Hence the deteriorating effects of standard encapsulants of the active part of a Silicon PV, e.g. Ethylene Vinyl Acetate a.k.a. (EVA) or Silicone, can be incorporated with the UV/IR absorbing nanocomposites, thereby sending the active part of the Silicon more usable photons and on the other hand saving the EVA from performance hinderers as EVA browning effects.

Moreover, when talking about organic photo voltaic (OPV), which generally have been proven as effective as ~6% into the conversion of solar radiation (at laboratory level), this marginally small increase becomes yet more important on a 2D OPV standard solar cell. However, going a step further and based onto the initial success in having created for the first time, composite fibers utilizing a well known Electro spinning technique, in an innovative way, it is also provided on being into a position of generating highly efficient quasi ~1D solar cell with PCE of more than the minimum necessary (~10%) for replacing the cSi technology at commercial level.

According to embodiments described herein, it is provided to utilize the Component1, with its proven property of energy down conversion (hence resolving in part absorption challenge), together with functionalized nanowires/nanotubes, such as Component2 (Nanowire/tubes of Molybdenum, Sulphur and Iodide family "$Mo_xS_yI_z$" as described for instance in WO2007051481A2) exploiting their already demonstrated property of being an efficient electron transfer materials, hence resolving the charge transport challenge.

With the possibility of having a tailored energy level of component3, a fullerene derivative, e.g. including but without limiting to, [6,6]-Thienyl C61 butyric acid methyl ester; empirical formula: $C_{70}H_{12}O_2S$ or [6,6]-Phenyl C61 butyric acid methyl ester; empirical formula: $C_{72}H_{14}O_2$, for OPV applications can be utilized in obtaining the quasi ~1D photovoltaic solar cell such that the challenge of charge separation can also be dealt with in major parts in conjugation to the commercial light absorbing (exciton generating) polymer e.g. including without limiting to: Poly(3-hexylthiophene-2,5-diyl): P3HT, and CdSe based Q-Dots.

In some embodiments, the fullerene derivative can also be e.g. bis(1-[3-(methoxycarbonyl)propyl]-1-phenyl)-[6.6]C62 (Bis[60]PCBM), which for example is a fullerene derivative with two substituents added to the fullerene cage, such that for instance the LUMO levels can be higher than [60]PCBM and also enhances its solubility in aromatic solvents.

Standard OPV is an organic solar cell, simple and economic to realize, which can also be printed, and has the advantage of being very flexible, thereby increasing the application sector by many folds, when compared to cSi solar cells. Embodiments described herein provide the synthesis of a hybrid organic-inorganic solar cell, into a co-axial layers composite fiber structure, utilizing hybrid composite nanomaterials according to the present disclosure, e.g. the components 1, 2, together with further materials, such as component 3.

To this objective, embodiments described herein provide, for the first time, as far as known, the "aligned" insertion of the abovementioned Component2, into the polymer matrix (e.g. Polystyrene), employing the technique of Electro spinning, proven via Scanning electron microscopy (SEM) images. This aligned insertion not only increases the composite materials' strength, but also renders them as a promising candidate for electron conduction (effect of tunneling at the nanoscale distances is typically expected) for the co-axial electrospun quasi 1D OPV. Furthermore, the present invention may provide utilizing the "physical" effects of e.g. component1 onto existing cSi solar cells in increasing their light absorption capability. Thereby, the deposition of the UV to Visible and IR to Visible nanocomposites, into the polymer solution, before carrying out the fiber generation, and using the Silicon panels as ground material for fiber collection at typical high collection voltages, whereby passing a hot-air gun onto the collected fibers can ensure, encapsulations and also the incorporation of nanocomposites which can convert UV to Visible and IR to Visible, given a choice of the lanthanide elements for creating the solution processed, hydrothermally generated, one pot, layered double hydroxide like nanocomposite materials.

Advantageous effects of the embodiments described herein are:

Based on the results from cSi solar cells, the possibility of having more than the actual ~6% PCE at a high fill factor (FF) in OPV are provided according to the present invention, as a direct consequence of component1.

Moreover, the immensely enhanced surface area (With a factor of PI-because of its Quasi~1D and infinite lengths of the electrospun fibers), can render the light capturing capability (thereby exciton generation probability) of the ~1D OPV much more than the present 2D based PV. Chemically engineered component2 and component3 can render their LUMO/HOMO levels such that they become efficient charge transfer materials.

Inside the co-axial electrospun fiber, the presence of the electron transferring component3 (together with commercially available Q-Dot/tetrapods of e.g. CdSe) and the electron conduction moiety, the component2 at the nearby vicinity promises the best conditions for charge carriers (after exciton's dissociations at the organic-inorganic interfaces) thereby avoiding recombination losses.

The uniform dispersions of the component2 (already demonstrated via electro spinning technique) and their interconnectivities using functionalized Au nanoparticles, which acts as the bridging atom (apart from uniformly dispersing the nanowires/tubes into the polymer matrix) has been already proven. With reference to the charge (electron) transport capabilities of these interconnected component2 and like networks, it is part of the present invention having synthesized a composite electron conducting material using electro spinning technique. As mentioned this synthesis will form part as the core of the co-axial electrospun fiber based hybrid solar cell according to the present invention.

In line with the results on cSi solar cell, the usage of component1 as a dopant for the outermost co-axial transparent layer (e.g. with commercial Indium Titanium Oxide (ITO) co-doped for hole conductions or using alternatives) is also foreseen together with the enhancements of the PCE owing to this doping, as a direct impact of light energy down conversion (UV conversion to absorption wavelength of P3HT as an example).

The middle layer, thickness ranging ~50-200 nm, or the commonly called bulk hetero junction (BHJ) comprising the mixture of component3 with commercially available electron donors (e.g. P3HT, Q-Dots) can render the co-axial geometry advantageous for realizing a fiber based hybrid solar cell.

According to embodiments of the present disclosure, a modified form of the ZnAlEuCoumarin HTLC Component1 can be provided, which can be code named Component1', which is provided with only one organic molecule as intercalate and has been successfully tested for its hydroxyl free radical scavenging effect. Component1', and hybrid composite nanomaterial derivable from, or equivalent to, Component1' according to the present disclosure, can be used for instance as a chemical sensor material.

In embodiments described herein, the Component1, in its modified form Component1', can work as reinforced chemical sensor, not limiting to hydroxyl free radicals, but also to other significant materials of interest.

Embodiments described herein provide the unification of the proven results from light energy down conversion material (component1) on cSi solar cell.

Embodiments described herein may provide utilizing the commercially available, conducting nanowires, such as for example obtainable from synthesis disclosed in WO2008013713A2, and further functionalizing them, which can render their dispersion into a polymer matrices of interest more uniform and aligned due to the high intensity electric field vectors acting at the electro spinning nozzle (Taylor cone), thereby an interconnected aligned network of the nanowires is provided in embodiments described herein for its enhanced conductivity of the electrons.

Embodiments described herein may provide employing the co-axial electrospinning technique into embedding the bulk hetero junction (BHJ) in between the outermost hole transporting cylinder and the innermost electron transferring core, which is a novel idea and will be realized with the obtained results for instance on the commercially available donor (P3HT, Q-Dots/Tetra pods etc) and acceptor (PCBM and other fullerene derivatives; Carbon and/or MoSI Nanowires and/or nanotubes etc) components.

As far as known the nearest approach of the coaxial electrospinning has been described in Adv. Energy Mater. 2012, DOI: 10.1002/aenm.201100674 in an article entitled: "Nanofiber-Based Bulk-Heterojunction Organic Solar Cells Using Coaxial Electrospinning", where the authors describe the creation of the bulk hetero junction with electrospinning, utilizing the generated electrospun fibers in between the standard cathodes/anodes in a 2D geometry. Embodiments described herein may provide combining the results from the Component1 with that of the successful electrospun aligned insertion of electron transporting inorganic materials (see e.g. WO2008013713A2 synthesized nanowires/nanotubes out of Metal-Chalcogen-Halogen systems or carbon based) on their appropriate functionalization, into a polymer matrix, in creating a compact organic solar cell.

Embodiments described herein may provide the successful insertion of inorganic nanowires via electro spinning with an applicative aim being different from that described for instance in WO2008013713A2, that too in an "aligned fashion" into the various possible "conducting" conjugated polymeric matrices of interest to OPV and charge transfer at par with the inserted nanowires/nanotubes (with a high degree of interconnectivity with that of the externally surrounding co-axial bulk hetero junction) extends the applicability of the nanowires synthesized and described for instance in WO2007051481A2, thereby rendering them available for purpose of efficient electron carriers through the bridging of the gold (Au) nano particles (used as precursor salts, $AuCl_4$ or as gold capped tails; Au-1-dodecanethiol [Commercially available Dodecanethiol functionalized gold nanoparticles]; and 1-Mercapto-(triethylene glycol)methyl ether functionalized gold nanoparticles which being soluble in a variety of polar and non polar solvents e.g.: ($H_2O$, acetone, acetonitrile, alcohol, chloroform, ethyl acetate, toluene) renders a vast majority of possible polymer hosts possible to disperse the functionalized nanowires for instance of WO2007051481A2.

Embodiments described herein may provide utilizing the high degree of dispersion of the, already proved, electron transfer materials of e.g. WO2007051481A2 and not limiting to MoSI in particular but with the initial tests over $WS_2$ nanotubes for their role as efficient electron transfer materials. Embodiments described herein may provide using the electrospun fiber for generating the co-axial fiber based hybrid solar cell.

Embodiments described herein may provide, based on the results from cSi solar cells, the possibility of having more than the actual ~6% PCE at a high fill factor (FF) in, as a direct consequence of e.g. component1 through light energy down conversion principle.

Embodiments described herein may provide that the immensely enhanced surface area (because of ~1D and infinite lengths of the electrospun fibers) can render the light capturing capability (thereby exciton generation probability) of the ~1D OPV much more than the present 2D based OPV. Chemically engineered, i.e. functionalized, component2 and component3 renders their energy levels near to the surrounding counterparts; such that they turn out to be efficient charge transfer materials.

Embodiments described herein may provide that, inside the co-axial electrospun fiber, the presence of the electron transferring component3 (together with commercially available Q-Dot/tetrapods of e.g. CdSe) and the electron conduction moiety, the component2, in nearby vicinity (nm scale) promises the best conditions for charge separation (after exciton's dissociations at the organic-inorganic interfaces) thereby avoiding recombination losses.

Figure 22:
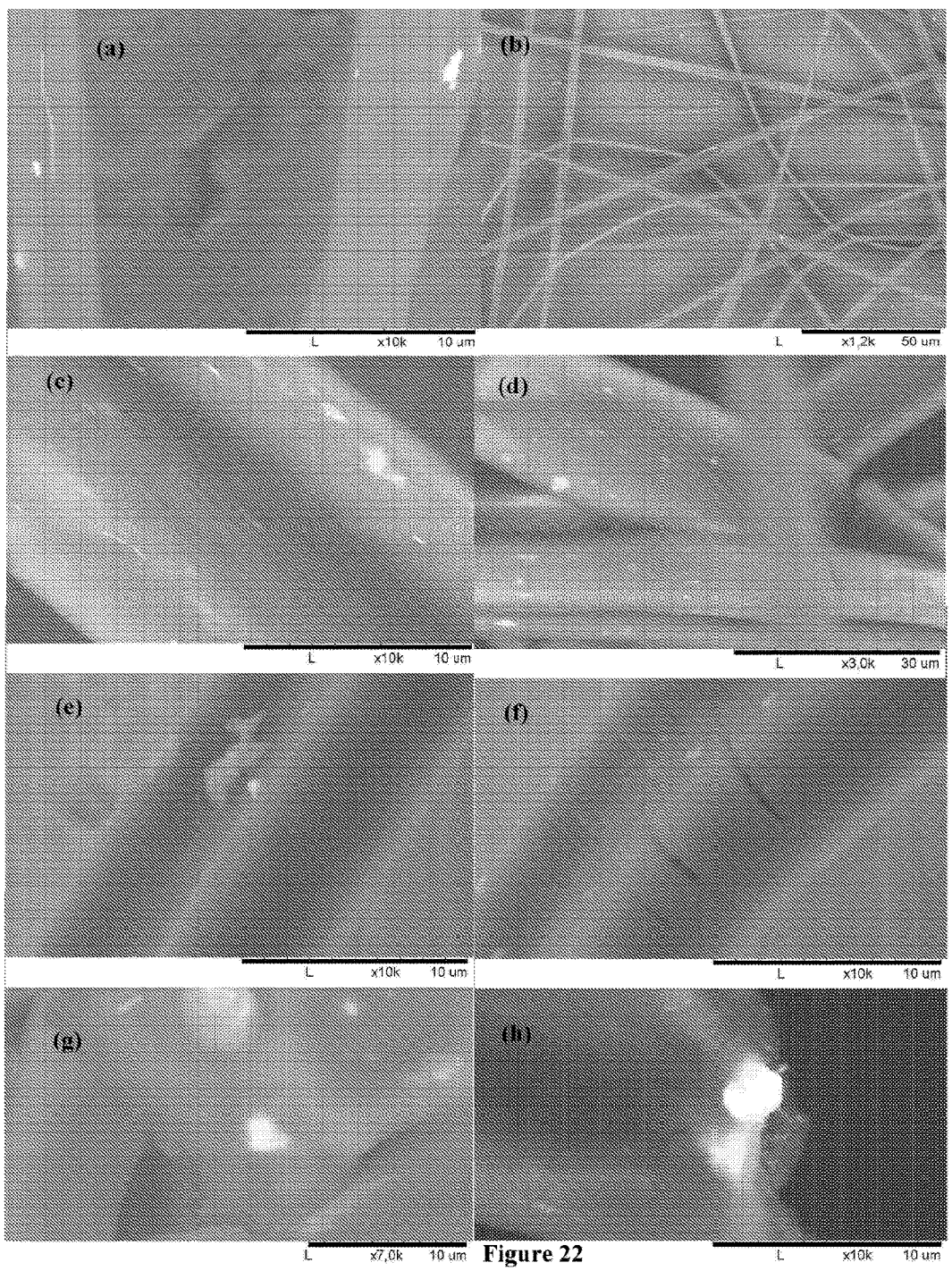
FIG. 22 provides SEM micrographs showing the possibility of forming a BHJ nanocomposite structure of P3HT/CdSe or PCBM/(MoSI) based OPV in line with the Electro Spun fibre matrix (a), SEM at 50 micron scale (b), while in (c-d), electro spinning conducted in the presence of Au capped 1-dodecanethiol solution, a perfect alignment can be seen (for increased charge carrier after exciton dissociation at the interfaces) and better homogeneity of the nanowires (such as component2, see e.g. WO2008013713A2), having interconnections with Au NP's. The electrons are supposed to tunnel from one MoSI nanowire network to other at the short nanoscale distances and hence form a unique conduction path. In the same Figure (e-f), it is shown the Polystyrene ElectroSpun alone without any nanostructures inside.

Embodiments described herein may provide the uniform dispersions of the Component2 (see e.g. WO2008013713A2 synthesis) via electro spinning technique and their interconnectivities using functionalized Au nanoparticles, which acts as the bridging atom (apart from uniformly dispersing the nanowires/tubes into the polymer matrix) (see e.g. FIG. 22). With reference to the charge (electron) transport capabilities of these interconnected component2 and like networks, it is provided having synthesized a composite electron conducting material using electro spinning technique. As mentioned this synthesis will form part as the core of embodiments of co-axial electrospun fiber based hybrid solar cell according to the present disclosure.

Embodiments described herein may provide, in line with the results on cSi solar cell, the usage of component1 as a dopant for the outermost co-axial transparent layer (e.g. with commercial ITO co-doped for hole conductions or using alternatives) which is also foreseen together with the enhancements of the EQE owing to this doping, as a direct impact of light energy down conversion (UV conversion to absorption wavelength of P3HT: The commercially available light absorbing donor material).

Embodiments described herein may provide that the middle layer or the commonly called bulk hetero junction (BHJ) comprising the mixture of component3 with commercially available electron donors (e.g. P3HT, Q-Dots) can be very useful for realizing a fiber based hybrid solar cell.

According to embodiments of the present invention, it is provided an organic-inorganic solar cell, also called hybrid Photo Voltaic (hPV) cell, comprising a composite nanomaterial according to the present disclosure, combined with electrospun aligned functionalized electron transporting inorganic material(s) inserted into a polymer matrix. In embodiments the hPV cell can be configured as a three layers co-axial electrospun organic-inorganic solar cell, wherein the electron transporting inorganic material may comprise functionalized-Metal-Chalcogen-Halogen or functionalized/organically modified carbon based nano wires/tubes and the hPV cell further comprising a charge separation material provided in the bulk hetero junction, which in particular comprises at least one fullerene derivative mixed with a light absorbing and efficient exciton generating polymer, such that an efficient light absorption/exciton dissociation and charge transport can take place in between the middle bulk hetero junction and the outer hole transporting and innermost electron carrying structures of the three layers co-axial electrospun organic-inorganic solar cell, respectively. Embodiments described herein also relate to a hPV cell which can be configured as a tandem solar cell, by repeating a plurality of the active layers. i.e. BHJ demarcated by e.g. carrier recombination zone, thereby connecting the tandem cells in series. Such a tandem configuration can provide direct increase onto the open circuit voltage, as observed into the state of the art at normal 2D level solar cell geometry, but a rather possible compromise onto the Fill Factor (FF) and the short circuit current ($J_{sc}$), when compared to the base level three layers electro spun hPV. In some possible implementations, the tandem solar cell can be provided as co-axial geometry with a core innermost cylinder conducting the electrons (e.g. ~2-3 micron thick) and the outermost superficial shell, the holes (e.g. 50 nm<thickness<200 nm), after their generation into the middle-shell (e.g. 50 nm<thickness<500 nm) bulk hetero junction (on exciton dissociation at the light absorbing polymer and the electron acceptor molecules' interface). Such implementations can ensure favorable conditions for avoiding recombination losses and hence a high fill factor (FF) with high open circuit voltage and short circuit currents, indispensables into the field of OPV's into achieving enhanced Power Conversion Efficiency (PCE).

According to aspects, the synthesis of Component1 is not only limited to europium, but also Sm and Gd ions were successfully inserted via well known hydrothermal synthesis clubbed with self-assembly processes under high temperature and pressure conditions.

According to aspects, extended applications owing to Sm and Gd inserted into the layered double hydroxides can also be included in the present disclosure. For instance, embodiments described herein may provide Component1' like hydrotalcite with the final product composed of ZnAlGd-Coumarin HTLC, thereby inserting Gd atoms in line with the europium insertion as above discussed in detail; the compound was found to be immensely magnetic with its affinity to iron containing metal objects, when bought in its vicinity.

According to aspects, the successful synthesis of ZnAlSmCoumarin and ZnSmCoumarin based layered double hydroxide structure can be of utmost importance for the industry at large since Sm plays an important role in Samarium-cobalt magnets, which are still valued for their ability to function at high temperatures. They are utilized in lightweight electronic equipment where size or space is a limiting factor and where functionality at high temperature is a concern. Further applications of samarium based hydroxide hydrates, include electronic watches, aerospace equipment, microwave technology and servomotors. Because of its weak spectral absorption band samarium is used in the filter glass on Nd:YAG solid state lasers to surround the laser rod to improve efficiency by absorbing stray emissions.

According to embodiments, it is provided the possibility of inserting into the brucite like layers, diverse possible M(II) and M(III) ions, which prompted towards the synthesis of Copper Indium Aluminium Selenide (CIAS; as possible CIGS-like) and with Iron (CIFS: As possible paramagnetic materials), for various purposes including eventually substituting the expensive production techniques for the realization of solar cell materials (e.g. CIGS) and furthermore with the induced defect in between the layers, the possibility to form a multiple solar cell with the formation of CIGS replica compound semiconductor in a p-n-p-n-n-n-p . . . fashion, thereby forming an array of cells in parallel (assisted with in situ Al doped ZnO phase as transparent conducting oxide); while it is also provided according to embodiments the possibility to realize a tandem cell, formed with that of the co-axial solar cell, discussed as one of the applications in Example 2, thereby expecting an enhanced $V_{oc}$. See above Table 1 and FIGS. 2, 3 and 4 for a detailed set of realized synthesis routes included in the present disclosure.

Figure 28A:
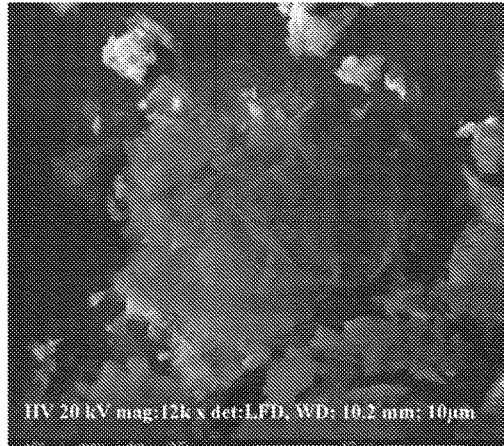
FIG. 28 provides a SEM micrographs showing layered/wafer morphology for ZnAlSmNitrate (a), ZnAlSmCoumarin (b) and ZnGdCoumarin (c).
Figure 28B:
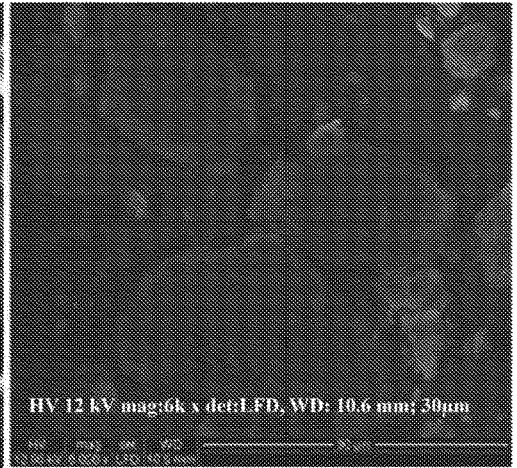
Figure 28C:
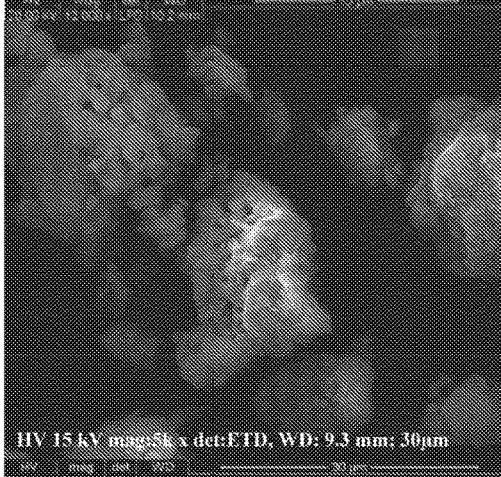

According to aspects, it is provided a layered material with Cu(II) In(III) Al(III)/Fe(III) (from precursors of Copper (I) chloride, Indium(III) chloride and Al(III) chloride and Iron (III) chloride), compensated with Selenic acid solution ($H_2SeO_4$), which after hydrothermal like synthesis and following the standard procedures, resulted to a phase having a luminescence lifetime of ~few microseconds see FIGS. 28-29 in relation to Example 3, thereby pointing towards a possible set of energy levels having a high band gap. Therefore, embodiments described herein may include the innovative aspect and synthesis possibility of the (Cu—In—Ga) based layered hydroxide structure into the formation of CIGS-like layered hydroxide structures viz. CIAS.

Furthermore the technique to exploit the formation of ZnO phase during the normal hydrothermal synthesis of Zn based HTLC like nano composites, opens a way to use it for an in situ formation of (e.g. n-type: Al doped ZnO as transparent conducting electrode). With the co-intercalation of $SeO_4^{2-}$, and with the possibility of bubbling the reducing agent ($SO_2$) externally, it is foreseen to locally reduce the $SeO_4^{2-}$ to $HSe^-$ which can continue to act as charge balancing specie within the modified CIGS-like composite structure.

According to aspects, the success into the synthesis of Component1, with lanthanide ion insertion and organic molecule intercalation, supported by successful realization of CIAS; CIGS-like materials, prompted to extend the hydrothermal synthesis to a one with $HSe^-$ as major anionic species, generated in situ via $SO_2$ and $NH_3/HCl_{(g)}$ bubbling in the presence of $A^{3+}$ (octahedrally coordinated-strained site occupying $Zn^{2+}$ interstitial position) and $Na^+$ ions (freely available in the solution) respectively, thereby realizing CIGS (replica) materials in a layered fashion, with default p-type character, while if the Al deficient compound is exposed to Indium ions, it retains n-type character.

Hence, embodiments described herein may include the aforementioned CIGS replica materials which has the intermediate structure:

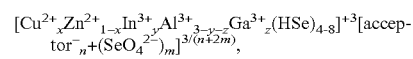

$[Cu^{2+}_xZn^{2+}_{1-x}In^{3+}_yAl^{3+}_{3-y-z}Ga^{3+}_z(HSe)_{4-8}]^{+3}[acceptor^-_n + (SeO_4^{2-})_m]^{3/(n+2m)}$, Embodiments described herein may provide the novel in situ reduction step, in the formation of the CIGS replica materials in particular providing that only $SO_2$ gas is bubbled into the reaction chamber at high T, P, such that the Se produced (from bulk Selenic acid and the intercalated one), can react with $Al^{3+}$. Thereby, controlled $Al^{3+}$ annihilation to alumina with simultaneous re-addition of $In^{3+}$, or not depending on the needs, can render the intermediate as n or p-type.

Embodiments described herein may provide that the CIGS like material with the controlled formation of Se, and hence its anionic counterpart ($HSe^-$ and/or $Se^{2-}$), either into the bulk (with the $Na^+$ ions and ammonia/HCl couple) or into the vicinity of the Aluminium ion, octahedrally coordinated with the nearby neighbors Cu/Zn/In/Ga, can give rise to a p-type phase, or an ordered defect compound (ODC) like n-type phase, depending onto the final reduction steps as described through the FIGS. 3 and 4.

According to aspects, the bulk anionic Se formation may result mainly into the formation of anionic Se ions which can counterbalance the positive charge or totally substitute the 2D layered structure in the sense that instead of —OH, the layer will be formed of octahedral sheets from Cu(SeH)$_6$, In(SeH)$_6$, Ga(SeH)$_6$, Al(SeH)$_6$, Zn(SeH)$_6$ like complexes.

In embodiments of the present disclosure, the final stoichiometry of the CIGS like replica materials can be controlled with the precursors materials and with the application of high (T, P) conditions at each step with the supply of SO$_2$ and Ammonia/HCl couple as detailed into the FIGS. 3 and 4. Furthermore the p-(Cu/Al deficient) and n-(In-rich) type character can also be obtained on the re-addition of the substitutional ions externally but during the hydrothermal stages.

A hPV cell according to the present disclosure may include CIGS like/replica material as absorbing layer, creating an organic-inorganic solar cell with a hybrid composite nanomaterial material as described herein and a material as obtainable from a method as above-discussed. In particular, it is provided the possibility of creating co-axial fibres with the standard original CIGS material and with a material as obtainable from a method as above-discussed, using e.g. Molybdenum as the core innermost transport layer, with e.g. functionalized Mo Nano wires/tubes, dispersed via electrospinning in close proximity, followed by CIGS, as the absorber layer (typical ~4-5 micron) and an array of thin outer shell "transparent" windows formed out of e.g. CdS/ZnO—Al with an anti reflection coating e.g. MgF$_2$; which can be generated as one of the possibility insitu with e.g. Component1 (on using starting precursor as Mg$^{2+}$ salt instead of Zn$^{2+}$) according to the reaction: MgO+(NH$_4$)HF$_2$→MgF$_2$+NH$_3$+H$_2$O; exploiting the little oxide phase which generates inevitably during high (T, P, t) conditions.

Embodiments of the present invention are further illustrated with supporting examples and possible applications as follows.

EXAMPLES

Example 1

Examples of coumarin containing hybrid layered double hydroxide like materials as hydroxyl free radical scavengers are hereafter provided. Such hybrid materials can be used e.g. as chemical sensor materials or as encapsulates for various molecules, such as: Deoxyribonucleic acid, HEME B, Delta 9 TetraHydroCannabinol or Cannabidiol (CBD), thereby with the already known effects of Coumarin as a site-specific drug delivery for inhibiting cancerogenus cells, via its chelating effect around them, we include the possibility of lanthanide doped, 2D layered double hydroxide like nano composite structures, capable of incorporating inside their 2D lamella, also the proteins and DNA molecules, as also the promising Cannibal or their derivatives etc. as CBD/or delta 9 tetrahydrocannabinol, as intercalates for cancer cells inhibition or treatment. Furthermore, electrospun porous fibers are known to be employed as a surface for enzymes to be immobilized on. These enzymes could be used to break down toxic chemicals in the environment with their possible intercalation into the layered double hydroxide and their further dispersions into the polymer solution, which can be spun, as a porous host. This method can lead to a one shot, Enzyme immobilization host surfaces along with its employment to engulf the toxic chemicals. For instance, to detect and inhibit the Hydroxyl free radicals, Cancerogenous cells or work as toxic chemical breakers, with the porous co-axial fibers acting as host for direct encapsulation of the active molecules from the group as described in paragraph 2 of the summary of this invention, inside the porous matrices or via their intercalation into the hydrotalcite like nanocomposite and its further dispersion into the porous co-axial matrices.

In specific, as toxic agents on the long run, the Hydroxyl free radicals are almost an inevitable part of the human lifecycle as they can be produced in a quite facile way: For instance they are formed and consumed inside the human body, by Vitamin C (found in many sources like vegetables etc), which interacts with the Cu$^{2+}$ ions derived from the copper containing water pipelines, installed in many countries.

Another application field of interest can be chemical waste disposals, where chemical bomb neutralization is often performed with the help of .OH free radicals which renders the explosives useless by attacking the active nitro groups (in e.g. TNT).

Thus, an effective remnant free radical neutralizer and/or sensor can be foreseen to act as an indispensable compound. Molecule1 (3CCA) is already proven to act as hydroxyl free radical scavenger via hydroxylation at its major 7$^{th}$ position to form 7-hydroxy-coumarin-3-carboxylic acid (7OH3CCA), see e.g. FIG. 5, which has its peculiar luminescent behaviour.

As an extended part of the present disclosure, a further objective is in exploiting 3CCA's scavenging ability and unifying it with the versatility of Europium containing LDH materials with its peculiar red luminescence. Hence, the stabilization of 3CCA alone into the layered inorganic host, containing lanthanide ions allowed us to obtain ZnAlEu-Coumarin based hydrotalcite (3CCA-Eu-HTLC), the Component1'.

Thereby, only Molecule1 was used as the intercalating organic species instead of both Molecule1 and Molecule2 as in Component1, where objective was to achieve light energy down conversion, concentrating onto the red emission of europium;

Thus, with only Molecule1 intercalated corresponding to the invention: Component1' was tested for its free radical scavenging; thereby formation of 7OH3CCA-Eu-HTLC phase was probed for, as detailed into the section ahead.

Free radical solution was prepared by mixing copper chloride and ascorbic acid according to the Fenton reaction[i]. 3CCA-Eu-HTLC powder was then dispersed onto this solution and left in continuous stirring mode on a magnetic stirrer for 12 hrs at room temperature (RT). The solution along with the dispersions were filtered and washed with excess milliQ water to remove the surplus ions. The filtered material was further dried at 60° C. for 2 hours in a ventilated furnace. 7OH3CCA-Eu-HTLC is formed.

It has been found that the synthetic yield (via Fenton's Reaction) of the hydroxyl free radical generation is small (≈12%) and hence its subsequent scavenging process via formation of 7OH3CCA in solution[ii] is also deemed not more than the available free radicals.

Whereas the yield of a successful attachment of .OH to form in "7OH3CCA" inside the layered structure of Component1' (i.e. using 3CCA-Eu-HTLC's Molecule1 as free radical scavenger material), is also expected to be affected by the diffusion of .OH into the layered double hydroxide's galleries and therefore a yield much smaller than 12% is expected.

The starting Component1' (3CCA-Eu-HTLC) and final product (7OH3CCA-Eu-HTLC) were deeply characterized to assess the effects of free radical solution on the short (NMR) and long (XRPD) range structure.

Indeed experimental data (X-ray diffraction and NMR data) in particular (see e.g. FIGS. 7 and 10) indicated that even this feeble interaction with free radical containing solution affected the structure of 3CCA-Eu-HTLC (see e.g. FIG. 7b).

The small loss into the crystallinity of 3CCA-Eu-HTLC, cannot be ascribed to free radical itself but also to the suspension in Fenton's' solution that can cause partial de-intercalation/de-lamination.

Figure 12:
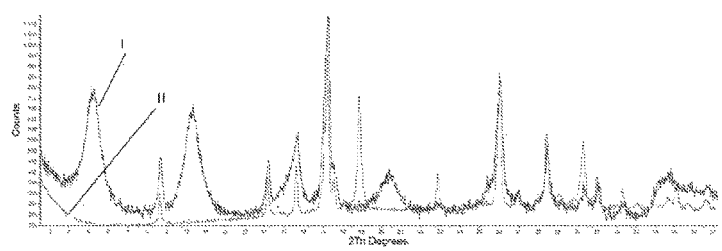
FIG. 12 shows a XRPD comparison for ZnAlEuCoumarin HTLC (blue phase denoted by I) with that of synthetically generated (via Fenton's reaction) 7OHCoumarin3Carboxylic acid (green phase denoted by II).

The XRPD Pawley fit analysis for the 3CCA-Eu-HTLC (see e.g. FIG. 7a) shows a layered structure (along with minor impurities), while Pawley fitting of 7OH3CCA-Eu-HTLC (see e.g. FIG. 7b) shows loss of crystallinity (peak intensity decreases), and decreased particle size (peak width increases) along with the presence of 7OH3CCA as an extra phase, as suggested by the presence of the same XRD peaks when 3CCA alone is exposed to the radical solution (see e.g. FIG. 12, green phase denoted by II, for more details).

The typical peak of 3CCA-HTLC was observed at a d-spacing of ~20 Å (2θ=4.4°) for the samples before (see e.g. FIG. 7a) and after (see e.g. FIG. 7b) exposure to free radical solution. This indicate that the hydroxylation reaction (see e.g. FIG. 5), does not chemically modify, apart from its major addition to the $7^{th}$ position, the size, shape and orientation of the intercalated organic molecule to affect the HTLC's interlayer distance.

The un-indexed peaks in FIG. 7b do not correspond to any Eu dense phases and neither to any un-reacted remnants, so it can be inferred that they correspond to the 7OH3CCA extra phase (as observed via peak overlap of the externally synthesized product on exposing the 3CCA to the hydroxyl free radical environment).

Figure 13:
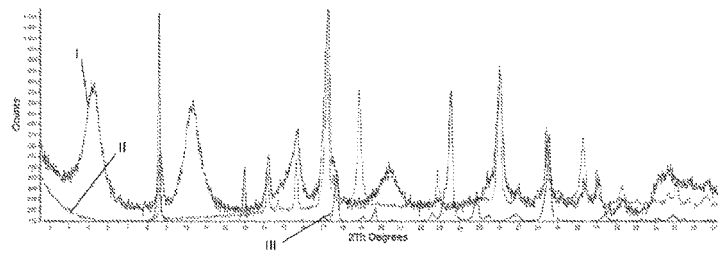
FIG. 13 shows a XRPD comparison for ZnAlEuCoumarin HTLC (blue phase denoted by I) with that of synthetically generated (via Fenton's reaction) 7OHCoumarin3Carboxylic acid (green phase denoted by II) overlapped with the ZnAlEuNitrate phase (black denoted by III).

In FIG. 12 the superposition of the product phase, obtained after 3CCA alone, and 3CCA-Eu-HTLC were exposed to freshly prepared hydroxyl free radical solution via standard Fenton reaction. The unfitted extra peaks at same position in (2θ) can be observed, thereby indicating that 3CCA-Eu-HTLC acts as free radical scavenger, following the footsteps of 3CCA, when independently exposed to Fenton reaction. FIG. 13 on the other hand incorporates also the diffraction pattern of ZnAlEuNitrate HTLC phase.

In particular, two mechanisms can be envisaged to support the hypothesis of the formation of 7OH3CCA extra phase: i) 7OH3CCA is formed into Eu-HTLC layers and then its de-intercalation occurs; ii) 3CCA-Eu-HTLC operates as an "on demand" 3CCA source, i.e. providing 3CCA when free radicals are available to react.

Although it may be deduced that the second mechanism is more probable because the short lived, OH free radical might not have the stability for diffusing un-reacted into the 3CCA-Eu-HTLC layers. However, a third possibility of hypothesizing a flux of excess OH free radicals flowing towards the "porous" interlayer cavity of the 3CCA-Eu-HTLC, which instils few "on demand" 3CCA de-intercalation.

Hence, a competition of affinities might better explain the process of hydroxylation resulting into few 3CCA de-intercalating and forming 7OH3CCA, while others get hydroxylated but continue remaining intercalated with a dominant mix, of ionic/covalent character.

Spin coated layered structure onto ITO coated PET thin films was further investigated by the GIXRD carried out from 0.2° to 2° as incidence angle to assess if the 3CCA-HTLC structure is maintained after spin coating (see e.g. FIG. 8). Component1' is observed at the typical position of 2θ=4.4° but it is much weaker (from thousands in FIG. 7a to tenths in FIG. 8 of observed counts per second), furthermore broadening of the collected peaks indicates that the thin film formation is accompanied with a loss of order. This effect, together with the less sensitivity of GIXRD measurement with respect to typical Bragg-Brentano para-focusing geometry used for powdered samples, may hinder from observing high order reflections in FIG. 8. Furthermore, two peaks (2θ=2.2 and 3.50) are observed only at the higher incidence angles and can be therefore be ascribed to the ITO-coated PET substrate. Whereas peak at 2θ=6.6° is the same impurity observed into the starting sample (see e.g. FIG. 7a).

The positive result from the GIXRD measurements indicated that a film with 3CCA-HTLC could be produced, with the layered structure without delaminating in volatile solvents, used for suspending the Component1' for spin coating and/or drop casting techniques.

The synthesized materials were analyzed by TGA/DTG techniques carried out in oxygen flux so as to assess their thermal resistance, to find the 3CCA⁻, $NO_3^-$ and water contents, and to investigate the organic-inorganic interaction. The TGA profile of the 3CCA-Eu-HTLC sample is depicted in FIG. 9, and shows peak at 120° C. indicating loss of intercalated water molecules. The subsequent weight losses around the temperatures 290-340° C. corresponds to the losses due to intercalated ionic nitrate molecules and degradation with further elimination of the 3CCA ligand molecules respectively. Further weight losses in the region above 400° C. correspond to the de-hydroxylation taking place from the layered 3CCA-Eu-HTLC. From the percentage loss of TGA data of 3CCA-Eu-HTLC, it can also be determined the amount of water molecules interacting with the HTLC layers corresponding to losses 150° C.≈9 wt %, at 290° C.≈10 wt % $NO_3^-$ and at 350° C.≈32 wt % organic loss (see e.g. FIG. 9a) on comparison with pure 3CCA TGA data.

TGA data of the 7OH3CCA-Eu-HTLC sample, obtained exposing 3CCA-Eu-HTLC to free radical solution, show as a similar trend in weight losses pertaining to intercalated $NO_3$ and organics, but both shifted to lower temperatures with respect to original 3CCA-Eu-HTLC. In specific: ≈4 wt % intercalated water molecules loss occurring at 150° C., ≈9 wt % $NO_3$ loss at 240° C.≈25 wt % organic loss along with step hydroxyl losses taking place in the range of 320-450° C., quite noteworthy is that the decomposition of 7OH3CCA, as organic loss, when not intercalated is supposed to take place at similar temperature as 3CCA.

However when 3CCA is intercalated (3CCA's thermal stability increases) and furthermore when this 3CCA intercalated Component1' is exposed to free radicals, the losses shift to lower T, hence little but not total nano-composite structure instability is underlined as was expected on exposure to the harsh free radical environment, emphasizing on the still stable hybrid structure.

Quantitative TGA losses (with respect to 3CCA-Eu-HTLC) corresponding to Nitrate and organic prove the argument of induced instability on exposing to free radicals environment thus indicating a loss of stability observed on exposing the 3CCA-Eu-HTLC to the hydroxyl free radical environment (see e.g. FIG. 9b). This decrease of stability of 7OH-3CCA-Eu-HTLC phase with respect to 3CCA-Eu-HTLC one is related also to the loss of crystallinity, as indicated by the XRPD data. The increased peak broadening after exposition of 3CCA-Eu-HTLC to free radical solution is consistent with a distribution of environments for the intercalated organic molecules. This broad distribution of environments suggests that the long range disorder observed by XRPD depends on the defective sites induced after the exposure of 3CCA-Eu-HTLC to the free radical environment.

A threefold increased luminescence decay lifetime from Component1'-Free radical (7OH-3CCA-Eu-HTLC), in consistency with previous trends, was observed for 614 nm emission with respect to Component1' (3CCA-Eu-HTLC). Furthermore the europium environment was found to have been affected by the 7OH3CCA formation (SS-Photoluminescence lifetime measurements), thereby depicting interaction with an enhanced chelation effect due to the presence of OH group on the "major" $7^{th}$ position of the 3CCA molecule, see e.g. FIG. 11c, thus demonstrating that europium plays an active role in parallel to 3CCA during the detection of the .OH free radical.

In FIG. 5 it is provided a schematic view (Grey=C, Dark grey=O, Snow white=H) of the scavenging effect on .OH free radical by 3CCA⁻ (left) to give 7OH3CCA⁻ (right).

In FIG. 6 it is provided a SEM micrograph (a) of 3CCA-Eu-HTLC taken over ITO conducting substrate via spin coating, showing the lamellar morphology together with EDAX map focussing on one of the agglomerates of 3CCA-Eu-HTLC-(b).

Figure 14:
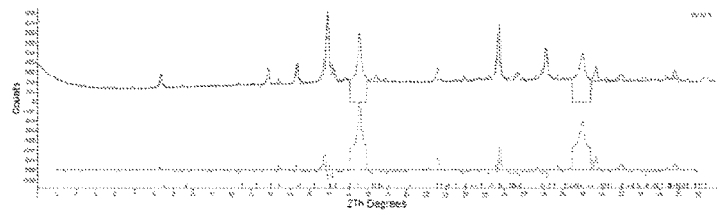
FIG. 14 shows a Pawley fit qualitative refinement of the 7OHCoumarin3Carboxylic acid phase generated on exposing the coumarin 3 carboxylic acid (3CCA) to the free radical generated via Fenton's reaction, showing a good fitting with unindexed impurity peaks.

In FIG. 7 it is provided a Pawley fit refinement of 3CCA-Eu-HTLC (a=b=3.044(2), c=17.410(8), space group "P6") (a), and 7OH3CCA-Eu-HTLC phase (with same cell parameters used for refinement) showing the broadened peaks of the degraded but still layered structure highlighted in red (b); extra peaks present at 2θ=17.3, 26.2 and 28.1° corresponds to free 7OH3CCA (see FIGS. 12, 13 and 14 for more details).

In FIG. 8 GIXRD data are provided showing the 3CCA-HTLC phase deposited onto ITO-coated PET in the angular range from 2 to 12° 2θ.

In FIG. 9 it is shown a TGA/DTG of 3CCA-Eu-HTLC sample carried out from 50° C. to 1000° C. with ramp rate of 10° C./min. before (a) and after (b) interaction with .OH free radical solution, i.e 7OH3CCA-Eu-HTLC.

Figure 10:
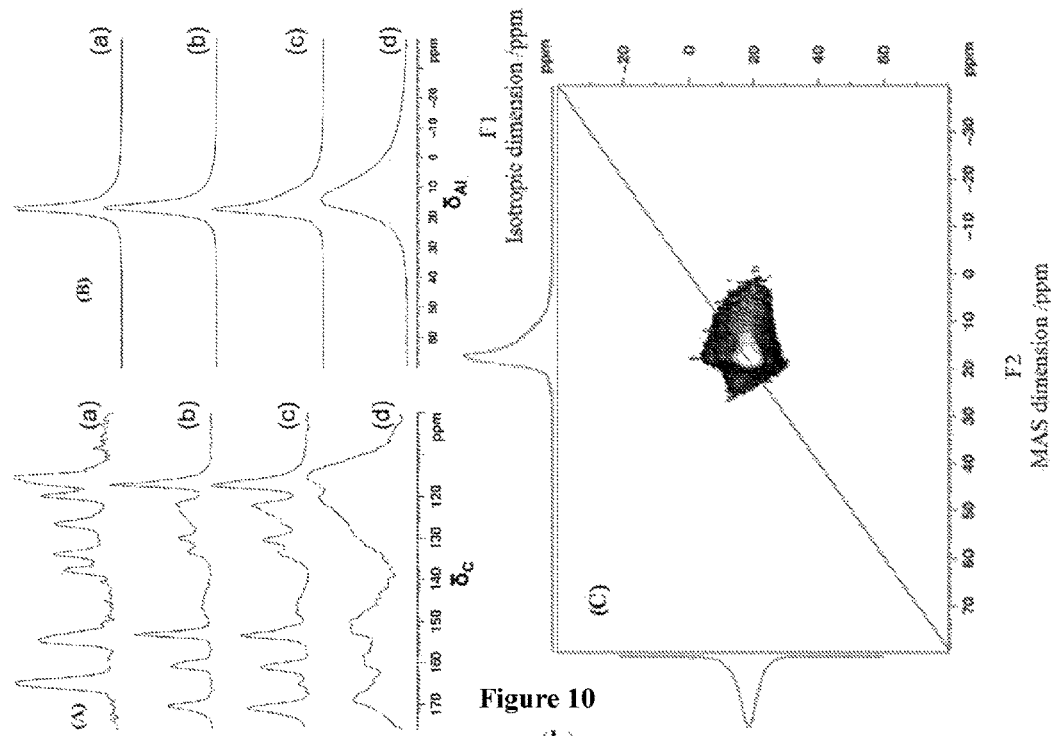
FIG. 10 provides 13C CPMAS NMR (A) spectra of 3CCA (a), ZnAlCoumarin15 (b), 3CCA-Eu-HTLC (c), and 7OH3CCA-Eu-HTLC (d). 27Al MAS NMR (B) spectra of ZnAlHTLC (a), ZnAlCoumarin (b), 3CCA-Eu-HTLC (c), and 7OH3CCA-Eu-HTLC (d), while 2D sheared 27Al 3QMAS NMR spectrum of 3CCA-Eu-HTLC with the isotropic projection along F1dimension (C).

In FIG. 10 $^{13}$C CPMAS NMR (A) spectra are provided of 3CCA (a), ZnAlCoumarin$^{15}$ (b), 3CCA-Eu-HTLC (c), and 7OH3CCA-Eu-HTLC (d). $^{27}$Al MAS NMR (B) spectra of ZnAlHTLC (a), ZnAlCoumarin (b), 3CCA-Eu-HTLC (c), and 7OH3CCA-Eu-HTLC (d), while 2D sheared 27Al 3QMAS NMR spectrum of 3CCA-Eu-HTLC with the isotropic projection along F1 dimension (C).

Figure 11:
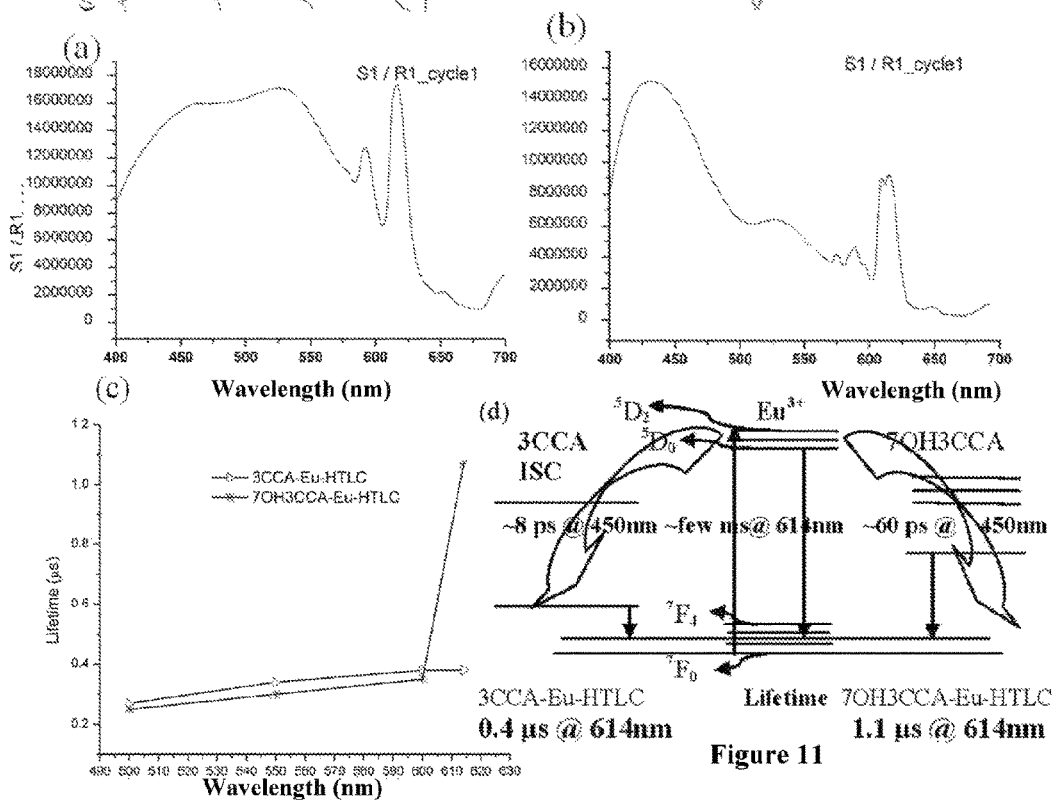
FIG. 11 provides solid state luminescence data showing the luminescent peak positions corresponding to excitation of 3CCA-Eu-HTLC at 394 nm (a), evidently enhanced signals, due to the formation of 7OH3CCA, in the range of 600-700nm (b) while decay lifetime variation for excitation at 394 nm and emission at 614 nm (Eu red emission) shown in comparison to 3CCA-Eu-HTLC and its hydroxylated counterpart, 7OH3CCA-Eu-HTLC (c); Whereas schematics showing the energy levels and corresponding decay life times increase after exposure to free radicals (d).

In FIG. 11 solid state luminescence data are provided showing the luminescent peak positions corresponding to excitation of 3CCA-Eu-HTLC at 394 nm (a), evidently enhanced signals, due to the formation of 7OH3CCA, in the range of 600-700 nm (b) while decay lifetime variation for excitation at 394 nm and emission at 614 nm (Eu red emission) shown in comparison to 3CCA-Eu-HTLC and its hydroxylated counterpart, 7OH3CCA-Eu-HTLC (c); Whereas schematics showing the energy levels and corresponding decay life times increase after exposure to free radicals (d).

FIG. 12 shows a XRPD comparison for ZnAlEuCoumarin HTLC (blue phase denoted by I) with that of synthetically generated (via Fenton's reaction) 7OHCoumarin3Carboxylic acid (green phase denoted by II).

FIG. 13 shows a XRPD comparison for ZnAlEuCoumarin HTLC (blue phase denoted by I) with that of synthetically generated (via Fenton's reaction) 7OHCoumarin3Carboxylic acid (green phase denoted by II) overlapped with the ZnAlEuNitrate phase (black denoted by III).

FIG. 14 shows a Pawley fit qualitative refinement of the 7OHCoumarin3Carboxylic acid phase generated on exposing the coumarin 3 carboxylic acid (3CCA) to the free radical generated via Fenton's reaction, showing a good fitting with unindexed impurity peaks.

Example 2

Example of design and development of novel hybrid materials for enhanced performance of Organic PV via Electro spinning technique is hereafter provided.

Component1 as already introduced, was probed for its energy down conversion effect on the existing cSi solar cell.

Utilizing the novel One Pot intercalation of anionic Coumarin 3 carboxylic acid (3CCA), Fluorescein and Europium insertion, into the ZnAl layered double hydroxide hydrotalcite (LDH HTLC), as next generation material for organic solar cells via:

Substitution of Al$^{3+}$ ions of LDH by Lanthanide ion (viz. Sm$^{3+}$, Eu$^{3+}$, Gd$^{3+}$).

Material characterization with XRPD, TGA, FTIR, SEM, NMR and SS-Photoluminescence.

Proof of successful down conversion: preliminary application onto concentrated c-Si solar cell by drop casting technique (Suspension in chloro Benzene).

Component1 is formed with seeds of Brucite like octahedral sheets undergoing lanthanide insertion via self assembly under hydrothermal conditions, wherein 2D [$M_{1-x}^{2+}$ $M_x^{3+}$(OH)$_2$] layers are formed at initial stages of the synthesis, followed by the substitution of M(III)=(e.g. Al$^{3+}$) ions by the doped lanthanide ions which carry with them the chelated organic counterpart(s).

The advantages of having a hybrid structure are: inorganic host instils higher temperature stability to the organic guest. Layered double hydroxide like materials have a good transparency to light, hence their function as spectrum doublets (especially at the red emission of ~614 nm) is worth exploiting for. As discussed a different choice among varied M(II), M(III) ions may directly affect the inter layer charge density. Ease of preparation (One-Pot) has been utilized for the synthesis of Component1 which has as its constituent organic intercalating species: coumarin 3 carboxylate anion 3CCA⁻, (with its SS-Absorption: in UV; 350-370 nm; and emission at 450 nm) while, (Fluorescein sodium salt having its SS-absorbance at 450 nm and emission at 550 nm). Thereby, Component1 has best absorption towards UV (310-370 nm) which accounts towards 8% of total Solar irradiated power. The high luminescence at 614 nm owing to the $^5D_0 \rightarrow ^7F_2$ transition of the europium atom, guarantees an enhanced absorption of the innovative low band gap (<2 eV) active layer bulk hetero junction materials (promising enough to achieve >10% external quantum efficiency) where such an OPV, in theory, absorbs the most (absorption maximum of state of the art light absorbing polymers).

A full characterization of the Component1 has been presented, together with the positive results of the test of the Component1, as energy down conversion material for the present cSi based Solar cell technology.

Lastly the novel idea of Co-Axial electrospinning composed of the Component1 as doped material, dispersed into the hole transport transparent layer (ITO/PEDOT:PSS based) and a standard bulk hetero junction (BHJ) comprising of but not limiting to (P3HT:PCBM/other fullerene derivative pair), or a modified polymer structure with (band gap=1.5-2 eV) of the donor/Acceptor mixture, such that the absorption of the BHJ active layer is enhanced, thanks to the additional red emission sent by the Component1.

Figure 15:
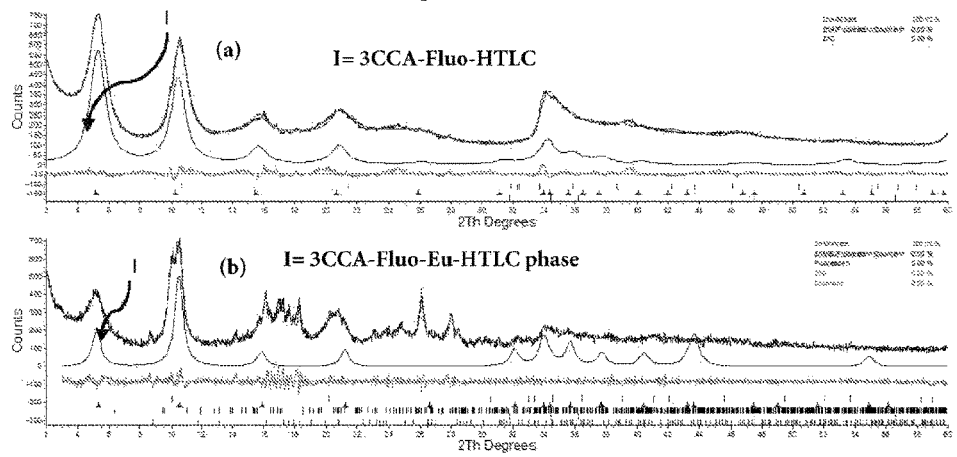
FIG. 15 shows Pawley fit refinement of 3CCA-Fluo-HTLC (a=b=3.044(2), c=17.410(8), space group "P6") (a), and 3CCA-Fluo-Eu-HTLC phase (with same cell parameters used for refinement) showing the broadened peaks of the lanthanide inserted HTLC phase; with highlighted 3CCA-Fluo-HTLC phase (in blue denoted by I).

FIG. 15 shows Pawley fit refinement of 3CCA-Fluo-HTLC (a=b=3.044(2), c=17.410(8), space group "P6") (a), and 3CCA-Fluo-Eu-HTLC phase (with same cell parameters used for refinement) showing the broadened peaks of the lanthanide inserted HTLC phase; with highlighted 3CCA-Fluo-HTLC phase (in blue denoted by I). Quite noteworthy are the facts that nearly all the phases got fitted with the Pawley fit refinement, thereby pointing towards NO-EXTRA phase (impurity) into the embodiments of the material according to the present disclosure (with and without europium presence).

Synthesis technique and characterization of ZnAlEuCoumarin:Fluorescein has been presented.

Coumarin:Fluorescein pair can be used in LDH since Peak Emission of Coumarin is peak absorbance of Fluorescein, taking the net emission maximum into the red visible region around 614 nm.

Europium ions can be used into the production of Component1 because well chelation of organic ligand with that of the vacant d-shells of the europium ion, creates degenerate energy levels, which result into ≈10 folds increase of $^5D_0 \rightarrow {}^7F_2$ SS RED emission at 614 nm with decay lifetime of the order of 4 μsec (when compared with Component1' lifetime of ~0.38 μsec). This enhanced lifetime is a symbol of a large energy gap, or multi-energy levels (degenerate levels).

Thereby, the novel idea of using the aforementioned Component1 into the Electro spinning together with the other counterparts as described in details with the corresponding initial results.

Figure 16:
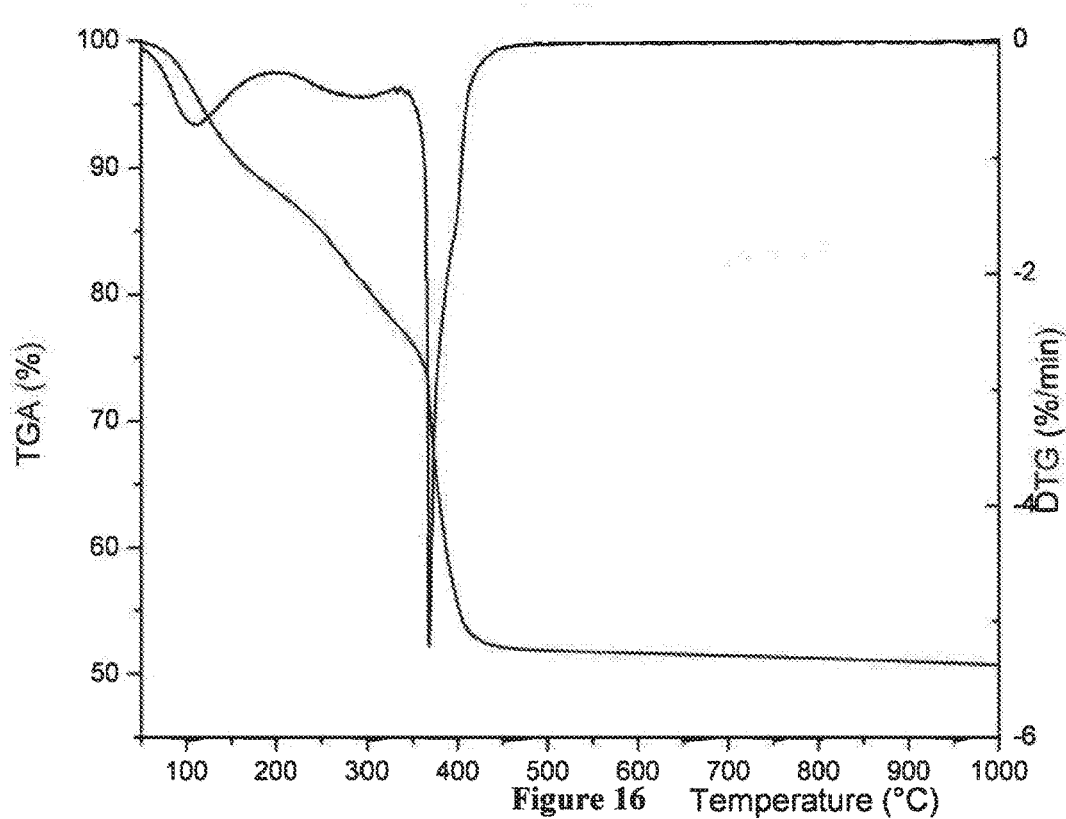
FIG. 16 shows thermo gravimetric analysis (TGA) of the ZnAlEuCoumarin:Fluorescein phase carried out in oxygenated environment.

FIG. 16 shows thermo gravimetric analysis (TGA) of the ZnAlEuCoumarin:Fluorescein phase carried out in oxygenated environment.

Figure 17:
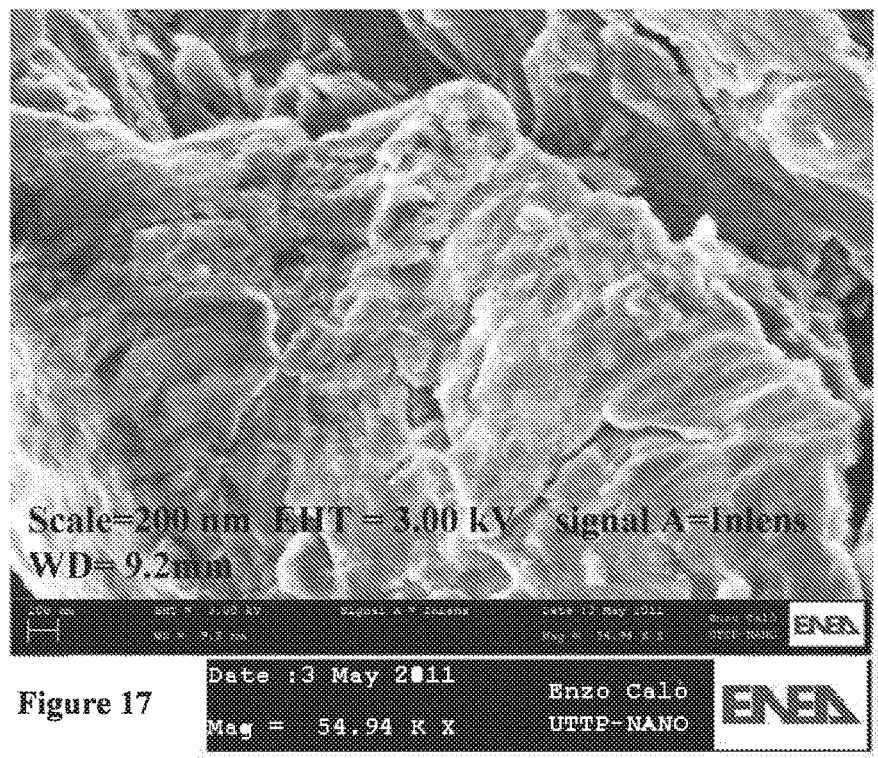
FIG. 17 shows SEM micrograph of the ZnAlEuCoumarin: Fluorescein phase over ITO coated glass substrate.

FIG. 17 shows SEM micrograph of the ZnAlEuCoumarin:Fluorescein phase over ITO coated glass substrate.

FIG. 18 shows that the energy of the $^5D_0 \rightarrow {}^7F_0$ transition is usually related to the so called nephelauxetic effect induced by the ion's first neighbors (3CCA in particular) it is proposed that in the ZnAlEuCoumarin LDH (Component1'), the $Eu^{3+}$ ions possibly occupy the interstitial sites with a lower local symmetry.

FIG. 19 shows the SS-PL of Component1, in which inter molecular energy transfer between Coumarin and Fluorescein molecular pairs can be clearly seen with an explicit increase into Europium's Red emission.

FIG. 20 shows a Luminescent Lifetime comparison of Component1, Component1' and of its free radical exposed product Component1'-7OH.

FIG. 21 provides the test on cSi under AM 1.5 conditions. The increase in external quantum efficiency (EQE) as a light energy down conversion material can be calculated as 100*(ΔArea/Ai) of the two triangles formed as shown in FIG. 21. In (a) it is observed, an enhanced EQE from increased UV absorption, via Component1 and its subsequent red emission at 614 nm. In the first graph above decrease of EQE in visible range, due to increase of reflectance, is shown, while in the second graph below an increase of EQE under 400 nm is shown, due to down conversion of light. Referring again to FIG. 21, excitation and emission SSPL spectra for CdSe Q-Dots in chloroform solvent is shown in (b), with max absorption occurring at 555 nm, implying a band gap of 2.24 eV and 3D excitation and emission SSPL spectra for commercial P3HT in chloroform solution is provided in (c), with max absorption occurring at 521 nm, implying a band gap of 2.39 eV.

FIG. 22 provides SEM micrographs showing the possibility of forming a BHJ nanocomposite structure of P3HT/CdSe or PCBM/(MoSI) based OPV in line with the Electro Spun fibre matrix (a), SEM at 50 micron scale (b), while in (c-d), electro spinning conducted in the presence of Au capped 1-dodecanethiol solution, a perfect alignment can be seen (for increased charge carrier after exciton dissociation at the interfaces) and better homogeneity of the nanowires (such as component2, see e.g. WO2008013713A2), having interconnections with Au NP's. The electrons are supposed to tunnel from one MoSI nanowire network to other at the short nanoscale distances and hence form a unique conduction path. In the same Figure (e-f), it is shown the Polystyrene ElectroSpun alone without any nanostructures inside. Where for concentration dependence of the NW precursors' cross-section of the 628 and 652 inserted NW's, showing the actual increased into the density of NW's on increasing the concentration of NW's from 5 mg/628 functionalized with 1-Dodecanethiol and without Au mediation (g) into 20 mg/652 with Au-1-dodecanethiol as functionalizing precursor (h) into a PS matrix of 30 and 33% wt respectively. The absorbance of the photons at the micron scale is deemed to increase the external quantum efficiency, owing to the immensely increased surface area for light absorption at sub-micron scale.

Hereafter description of embodiments of the co-axial electro spinning including possible components inserted in each cross-section is provided.

Figure 23:
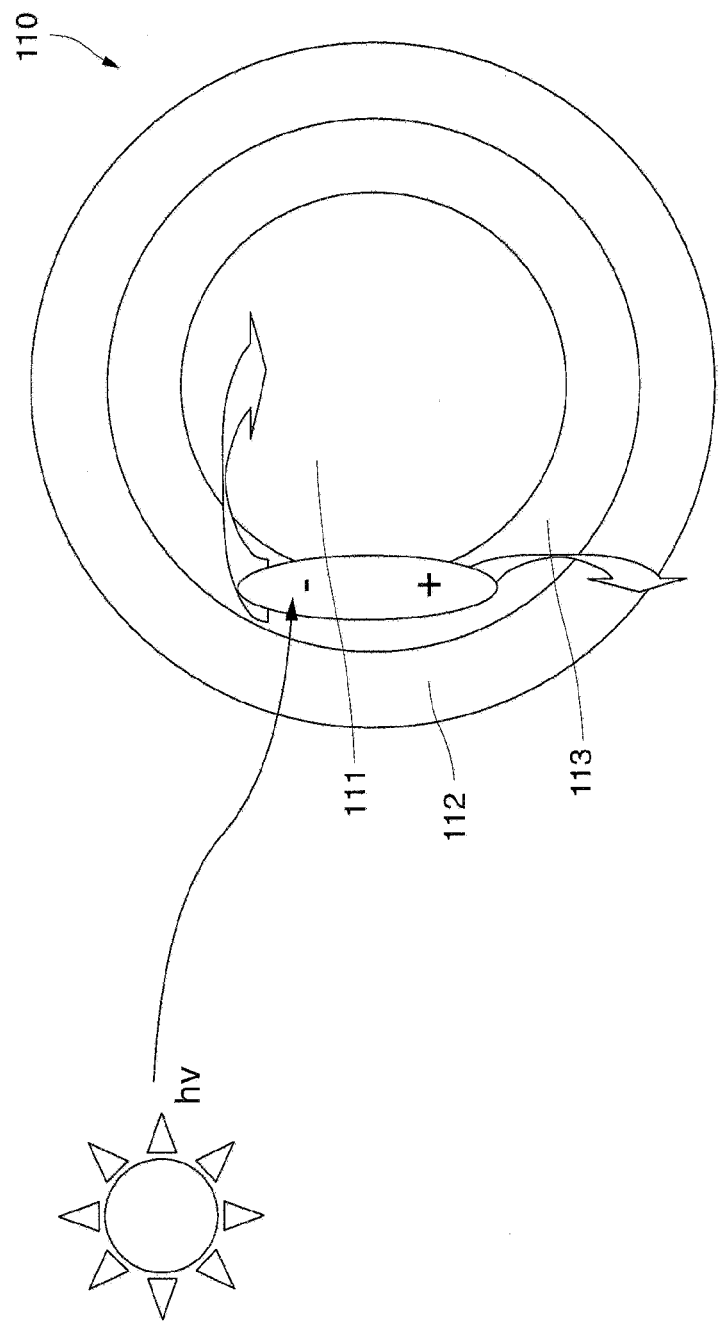
FIG. 23 describes embodiments, all combinable with embodiments described herein, of a co-axial composite fiber based quasi 1D (one-dimensional) solar cell 110 according to the present disclosure.

FIG. 23 is used to describe embodiments, all combinable with embodiments described herein, of a co-axial composite fiber based quasi 1D (one-dimensional) solar cell 110 according to the present disclosure which can include:

an inner core 111 containing a functionalized nanowires/nanotubes component, such as e.g. component 2: MoSI nanowires/$WS_2$ nanotubes or Carbon based, provided for electron conduction or other conducting metallic pigments available commercially, synthesized in-house encapsulating Aluminium wafers with Calcium shells, in line e.g. with Ag@Cu available at commercial level; for example, an injection pulsed feed carrying a cathodic solution/paste can be provided, e.g. Silver@Copper Pigments already commercially available in market by "ECKART" and commonly used as coatings for rendering textiles as conducting. Other close context to OPV examples can be Ca@Aluminium, rendered viscous enough to compete with the flow rate of the initial core material, which is substituted, thereby avoiding the perceived micro fabrications, at least at the level of cathode deposition/insertion into the inner most core of the co-axial fiber based organic-inorganic solar cell (hPV);

an outer core 112 having hole conducting layer (such as PEDOT:PSS or nanowires in general and that out of Silver in particular) doped with solution based Indium Tin Oxide (ITO) and co-doped with a HTLC like composite nanomaterial according to embodiments described herein, e.g. component1, to provide a competitive hole transport layer aiming at efficient hole transport with enhanced exciton generation;

a middle ring 113 containing the bulk hetero junction (BHJ) formed with electron donor (e.g. P3HT/PFT/CdSe) and acceptor molecules (e.g. fullerene derivatives, such as Component3: PCBM/fullerene derivatives).

The Example 2 can be summarized by the possible applications of Component1, along with commercially available counterparts, into the formation of a compact co-axial solar cell based on the property of Component 1 of down conversion and successful functionalization/aligned insertion results of one of materials (nanowires) shown e.g. in WO2008013713A2, into a polymer matrix (e.g. polystyrene or polyethylene oxide), while the Component1 can be incorporated with various possibilities into the hole transport layer as dopant material and using P3HT or any other low band gap donor polymer material, with one of its maximum absorption edges being near to the red emission of the Component1, so as to capture most of the UV-Red converted part along with functionalized nanowires but not limiting to (as efficient electron transfer materials); dispersed into the core of the 3 tier co-axial electrospun fiber. The middle shell in this case can be a standard BHJ with tuned energy levels of the participating entities, e.g. PCBM and their derivates and/or functionalized uniformly dispersed Q-Dots e.g. CdSe.

Example 3

The successful synthesis of a layered structure with Molecule1, in particular, intercalated via self assembly approach under high T, P conditions, together with a simultaneous insertion of Lanthanide elements of interest, e.g. Sm and Gd, is summarized in the attached FIGS. 24 to 28. It is to be noted that the lanthanide ions are acting as the sole trivalent ion, with no $Al^{3+}$ present as the precursor material for the synthesis of the layered structures, once again pointing towards the success of the lanthanide ion insertion via substitution of the M(III) ions, inside the brucite like layer on the application of the novel one-pot hydrothermal synthesis in conjugation to probable self-assembly processes occurring under high T, P, t conditions.

Figure 24:
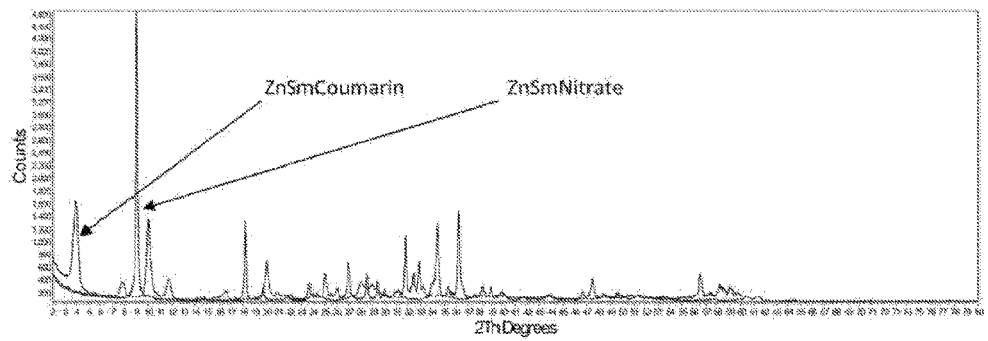
FIG. 24 provides a XRD comparison of ZnSmCoumarin and ZnSmNitrate HTLC like nanocomposites (no Aluminium).

In FIG. 24 it is provided a XRD comparison of ZnSm-Coumarin and ZnSmNitrate HTLC like nanocomposites (no Aluminium).

Figure 25:
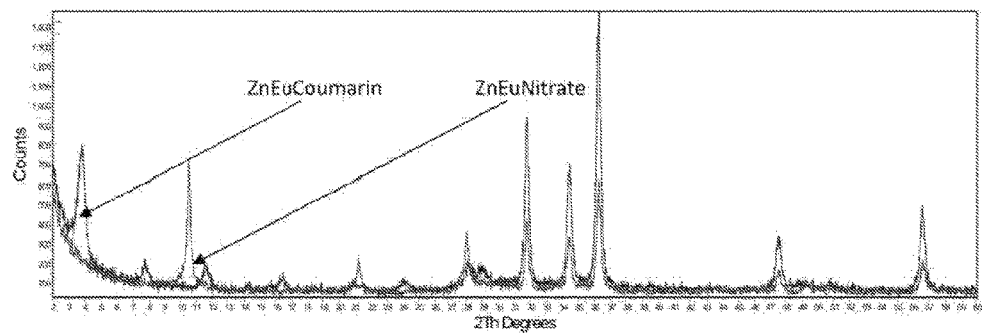
FIG. 25 provides a XRD comparison of ZnEuCoumarin and ZnEuNitrate HTLC like nanocomposites (no Aluminium).

In FIG. 25 it is provided a XRD comparison of ZnEu-Coumarin and ZnEuNitrate HTLC like nanocomposites (no Aluminium).

Figure 26:
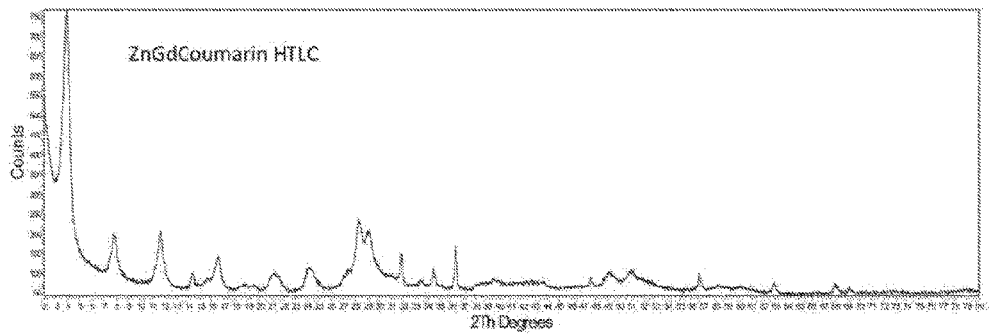
FIG. 26 provides XRD data of ZnGdCoumarin HTLC like nanocomposite (no Aluminium).

In FIG. 26 it is provided XRD data of ZnGdCoumarin HTLC like nanocomposite (no Aluminium).

Figure 27:
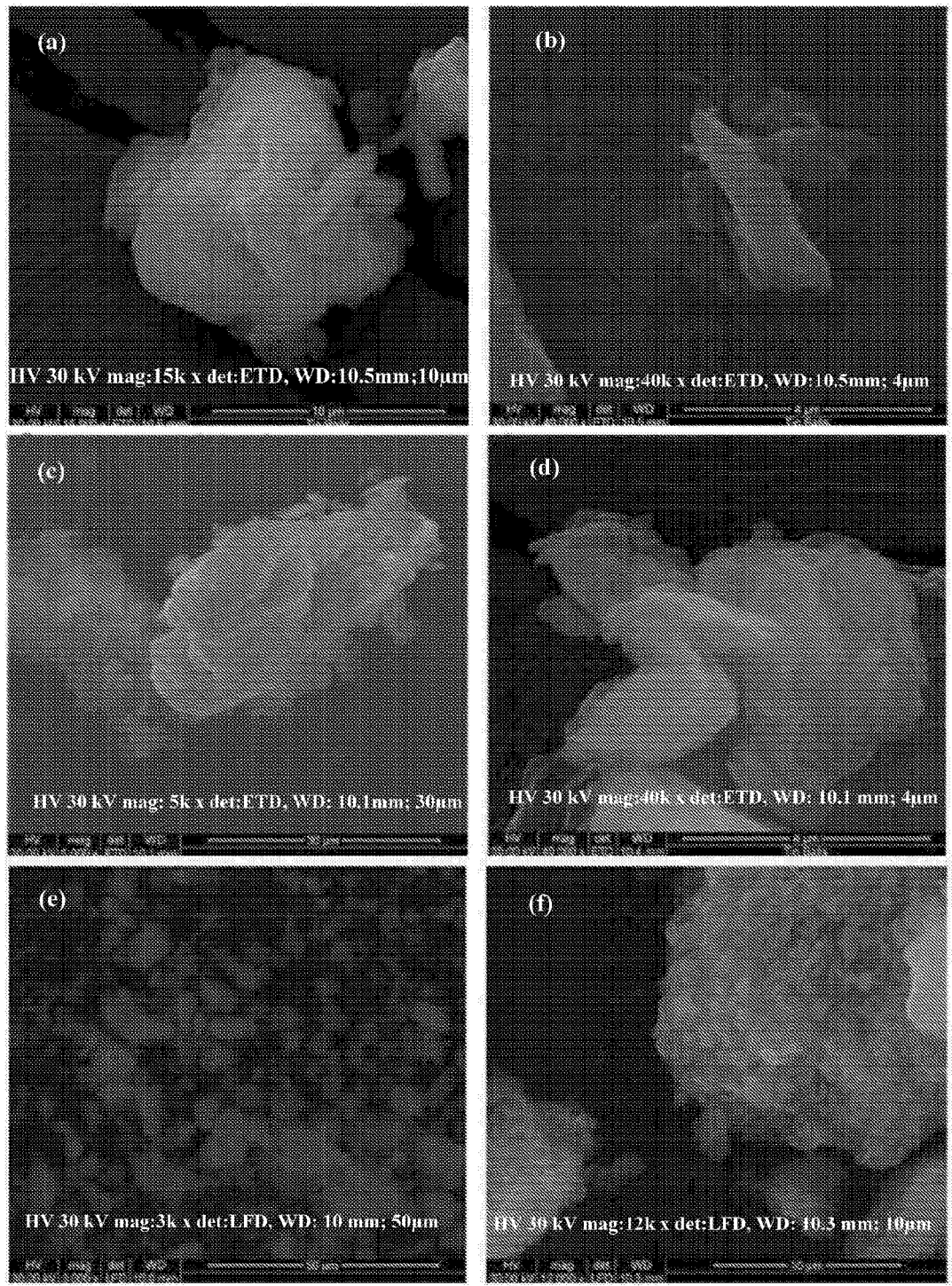
FIG. 27 provides SEM micrographs of various HTLC based on ZnAlNitrate (a-b), ZnAlCoumarin (c-d), ZnAlEuNitrate (e) and ZnAlEuCoumarin (f).

In FIG. 27 it is provided SEM micrographs of various HTLC based on ZnAlNitrate (a-b), ZnAlCoumarin (c-d), ZnAlEuNitrate (e) and ZnAlEuCoumarin (f).

In FIG. 28 it is provided a SEM micrographs showing layered/wafer morphology for ZnAlSmNitrate (a), ZnAlSm-Coumarin (b) and ZnGdCoumarin (c).

Furthermore an extended synthesis of the CIGS like structure is also carried out according to embodiments of the present disclosure, on modifying the precursor materials and following the similar steps of the hydrothermal synthesis, but with the anionic specie this time, such as Selenium tetraoxide (from Selenic acid at pH>7 environment) and it is supposed to intercalate into the layered material. See SSPL in FIGS. 29 and 30 showing the high band gap layered hydroxide like materials:

In particular, FIG. 29 provides 3D excitation and emission spectra of $[Cu_xIn_yAl_{(1-y)}(OH)_4]^{+1}[(SeO_4^{-2})]^{1/2}$ (CIAS) from group I-III-VI2, which show a decrease in emission intensity at Near UV (350 nm) excitation, thereby pointing towards it being a high band gap transparent material.

Figure 30:
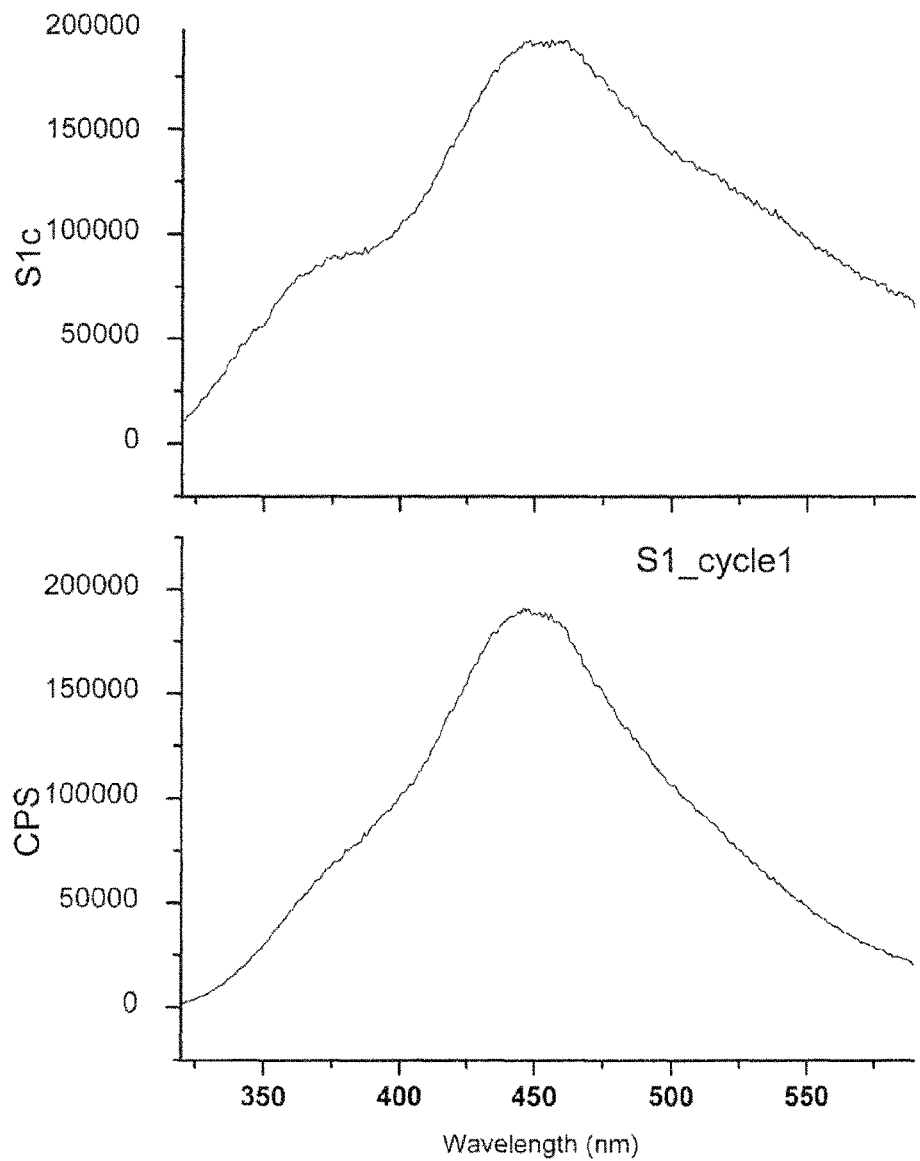
FIG. 30 provides CuInFeSeO4-2 (CIFS: Magnetic materials) Excitation at 300 nm and emission from 320 nm onwards, showing a high band gap transparent material.

FIG. 30 provides $CuInFeSeO_4^{-2}$ (CIFS: Magnetic materials) Excitation at 300 nm and emission from 320 nm onwards, showing a high band gap transparent material.

Figure 31:
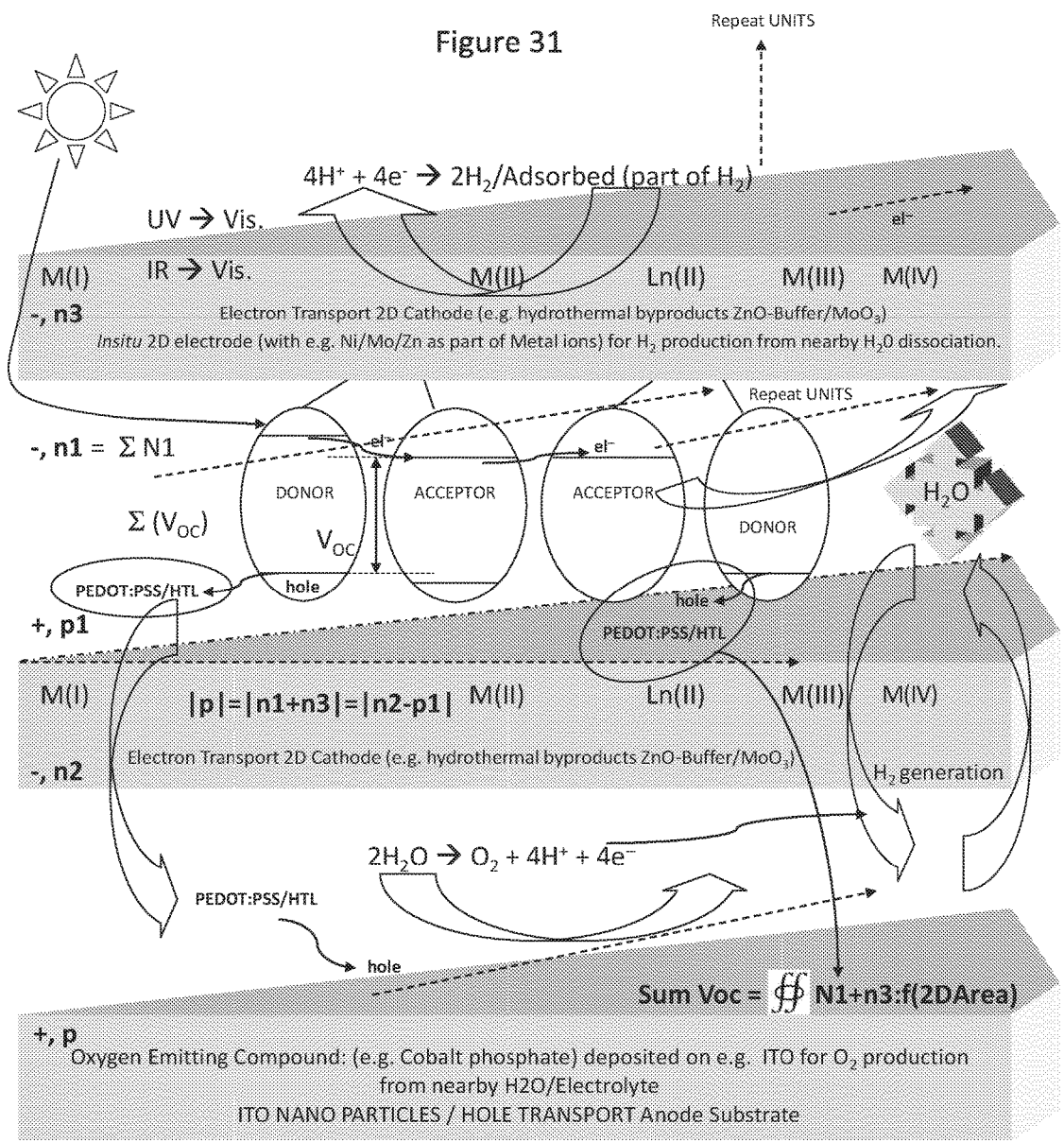
FIG. 31 provides a scheme of a nanoscale Photoelectrochemical Cell (PEC).

FIG. 31 provides a scheme of a nanoscale Photoelectrochemical Cell (PEC), which can be obtained in the presence of an apt light harvesting species (DONOR/ACCEPTOR pair), with the source of water being the one stored inside the layered double hydroxide or via external means through humidity or diffusion from the aqueous Electrolyte surrounding the nanocomposite material, wherein the DONOR/ACCEPTOR pair can be any combinations of organic compounds having at least one of the functional group from among the following: Hydroxyl (R—OH), Carbonyl ($R_1$—C=O—$R_2$), Carboxyl (RCOOH), Amino ($RNH_2$), Phosphate $(ROP(OH)_2=O)$, Sulfhydryl (R—SH) and pertain non exclusively to the class of Enzymes or Proteins, Porphyrin or Cannabis. For instance, at least one organic or inorganic moieties, or their "Derivatives", from among: Azole, Polybenzimidazole, Polythiophene, Fullerene, or acids (Perfluorosulfonic acid, Deoxyribonucleic acid, HEME B, Delta 9 TetraHydroCannabinol or Cannabidiol (CBD) or Coumarin-3-carboxylic acid (Coumarin) or Fluorescein or other Dye) or salts thereof, with similar light harvesters grown directly on the layered double hydroxide 2D lamella, as in: Inorganic (Quantum dots or rods or tetrapods), or as metal oxides e.g. M(I-IV) ions, inserted into the 2D lamella, oxidised with the dissolved oxygen of the hydrothermal media, as in the formation of Zinc Oxide when M(II)=Zinc; while the intercalated moieties (organic Dye or inorganic components) could act as its sensitizers, as in $Eu^{3+}$ sensitized via Coumarin and Fluorescein.

Figure 32A:
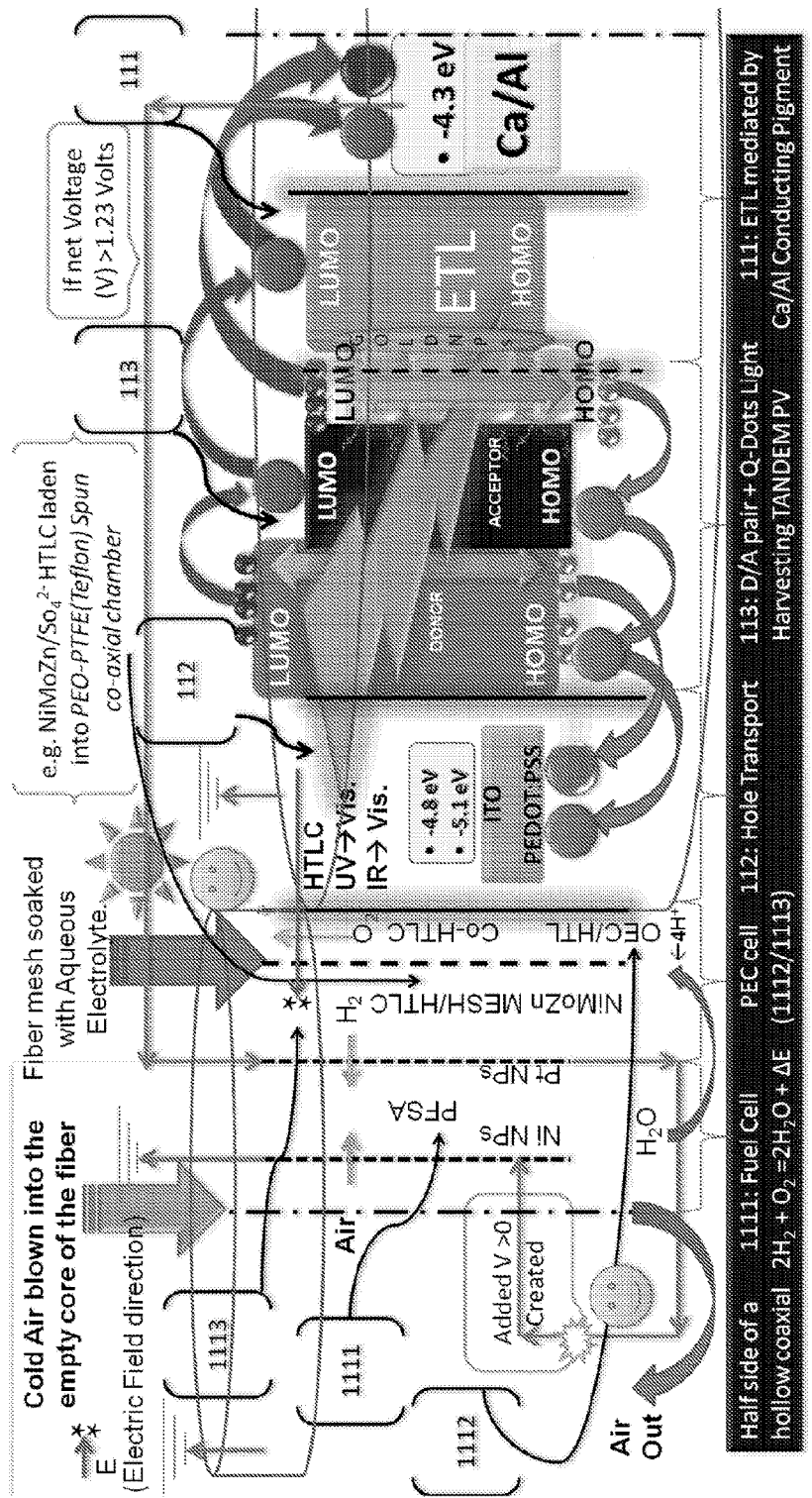
FIG. 32 (a) provides a scheme of an organic inorganic solar cell cross-section, which could be realized by heavily incorporating typical oxygen emitting compounds.
Figure 32B:
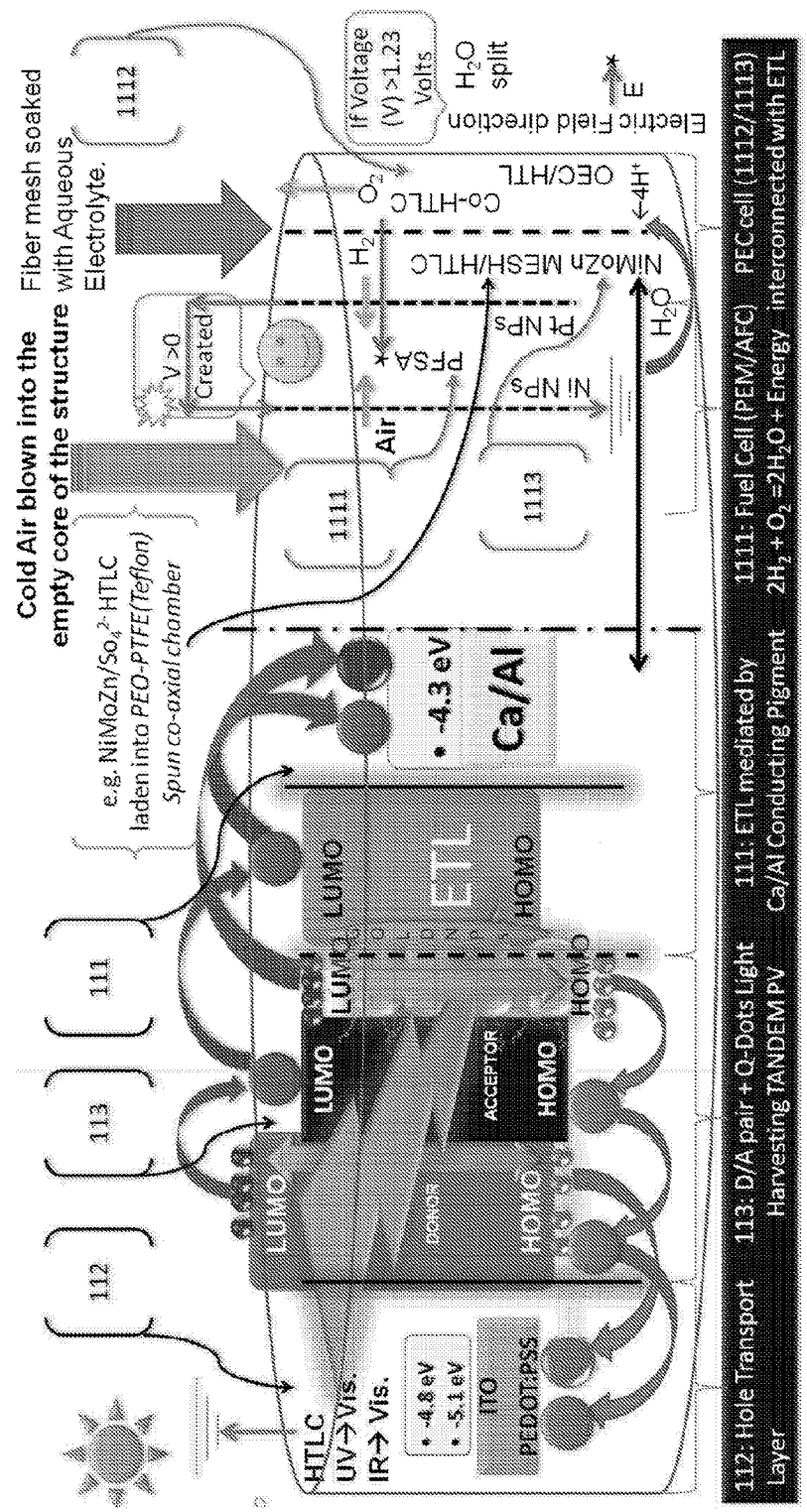

FIG. 32 (a) provides a scheme of an organic inorganic solar cell cross-section, which could be realized by heavily incorporating typical oxygen emitting compounds, e.g. Cobalt based into the co-electrospun (or produced via similar spinning techniques e.g. Wet, Dry, Melt, Extrusion, Direct, and Gel Spinning, at micro or macro level) (1112) layer, for the oxygen evolution via water splitting, from the side-by-side microscale coaxial PEC combination (running in spiral or in parallel fashion to the organic inorganic solar cell).

It is also noted that the same could be realized via separately constructed, at macro/industrial scale keeping a similar ideology, for dissociation of adsorbed water content in the (1112) layer through the dispersed materials', synthesized following the hybrid nanocomposite synthesis route for realizing the cathode and anode; so as to submit the relevant PEC-Layers to a certain potential difference and hence its circuit could be completed with the electrons produced from the organic-inorganic solar cell, or from any other power source, whereby providing a net, local to the anodic oxygen emitter, potential difference of >1.23 V for water splitting, which can be further transmitted via an external circuit onto the Nickel based cathode (e.g. NiMoZn or NiMg based alloy) structure for Hydrogen evolution and/or adsorption of part thereof (as metal hydrides accomplished inside the porous oxides of the precursor hydrotalcite materials), obtained through calcinations of the precursor hydrotalcite like materials with doped Ln ions inside the 2D layers, of which the constituent metal ions could be as an example (Ni, Co, Mg, Al, Li) along with any of Lanthanide elements, and are inserted as a co-phase along with the cathodic hydrotalcite like nanocomposite. The cathode material can be synthesized along with the noted synthesis routes, as an example, via hydrothermal synthesis of a hydrotalcite like nanocomposite out of for example Ni, Mo and Zn metal ions, in the presence of Ln-ions and in line with the synthesis described in details in this invention, whereby they can be heavily incorporated into the co-electrospun (or produced via similar spinning techniques e.g. Wet, Dry, Melt, Extrusion, Direct, and Gel Spinning, at micro or macro level) (1113) half of the PEC cell.

Furthermore, always exploiting the plurality of the structure and incorporating, insitu at micro scale or separately at a large/macro scale instead of micro level, an innovative Fuel Cell, which can be like a Direct methanol fuel cell (DMFC) or Proton exchange membrane fuel cell (PEMFC) or Alkaline Fuel Cell (AFC) or Phosphoric Acid Fuel Cell (PAFC) or molten carbonate fuel cell (MCFC), or Solid oxide fuel cell (SOFC); is also envisaged upon. Whereby, the produced Hydrogen could be constrained to be consumed near their production site when coming in contact with the interfacial (1113/1111) Platinum nanoparticles/or similar electrode which can function as a hydrogen gas dissociation catalyst. Other sources for hydrogen and/or fuels for the fuel cell can be: Those produced via injected ethanol or R—OH; R=organic with #C atoms>2 into the 1113 chamber of the PEC cell with dispersed hydrotalcite like nanocomposites reforming the alternative fuel for hydrogen production OR as anode catalyst directly extracting hydrogen out of the methanol and ionising it insitu, whereby the injection of methanol into the 1113/1111 interface is envisaged upon);

In these cases, the PEC cell is supposed to be simultaneously releasing oxygen into the atmosphere from the (1112) chamber, with an inflow of atmospheric air into the empty core of the inner envisaged Fuel Cell structure assuring cooling of the micro/macro level Fuel cell device, and also atmospheric oxygen dissociation at for example the Nickel based (1111)/air interface, with for example either perfluorosulfonic acid (PFSA) or Potassium Hydroxide soaked matrix, or Phosphoric acid soaked matrix forming the (1111) section of the fuel cell electrolytic compartment; which can be realized inside the pores left over by water soluble polymer, used as a co-polymer for coaxial fiber creation via electrospinning or High definition micro extrusion (or produced via similar spinning techniques e.g. Wet, Dry, Melt, Extrusion, Direct, and Gel Spinning, at micro or macro level); Thereby generating additional Energy with the excess of the power generated by the common Renewable Energy sources, including the organic inorganic PVs as shown in this invention, hence rendering the Hydrogen economy much more feasible, not only from its expected enhanced Energy conversion efficiency, produced and catalyzed via nanocomposites dispersed into an innovative co-axial geometry (PEC/Fuel Cell) at micro or macro scale thanks to the enhanced active area, by a factor of mathematical PI (With Half surface area=PI/2), when compared to the deposition of the same materials over a flat 2D geometry, but also with its insitu storage through apt adsorbents (calcined La-doped precursor layered double hydroxides with Ni and/or Mg as at least one of the constituent metal ions), for further use when in need, all auto-sustained via the initiation step; i.e. Voltage provided into the PEC part, from the core organic-inorganic based solar cell (110) or any other power source aimed at water splitting, applied onto the co-axial PEC envisaged in this invention.

FIG. 32 (b) on the other hand describes schematically the possibility of having the PEC and/or Fuel cell combination, into the remaining half of the fiber based co-electrospun (or produced via similar spinning techniques e.g. Wet, Dry, Melt, Extrusion, Direct, and Gel Spinning, at micro or macro level) solar cell. This possibility is shown as one of the many similar possible combinations around the co-axial Fiber based organic inorganic solar cell, constituting in a non exhaustive way, the possible device structures, both at nano/micro scale and at macro/Industrial scale. Employing thereby, the CIGS like nanocomposites while exploiting their -----n-p-n-p-n-p--- repetitions as described in this invention, into the co-axial chambers for applications into the coaxial organic-inorganic solar cell, or as part of the complementary PEC or Fuel Cell geometry or electrodes thereof.

While the foregoing is directed to embodiments of the invention, other and further embodiments of the invention may be devised without departing from the basic scope thereof, and the scope thereof is determined by the claims that follow.

The invention claimed is:

1. An organic-inorganic solar cell comprising a composite nanomaterial combined with electrospun aligned functionalized electron transporting inorganic material(s) inserted into a conducting polymer matrix, wherein the composite nanomaterial comprises a hydrotalcite like layered double hydroxide compound provided with one or more lanthanide elements inserted into 2D layers and one or more organic compounds having at least one of entities and their derivatives selected from among: azole, polybenzimidazole, polythiophene, fullerene, acids, and salts thereof, intercalated between them.

2. The organic-inorganic solar cell of claim 1, wherein the organic-inorganic solar cell is configured as a three-layer co-axial electrospun organic-inorganic solar cell, the electron transporting inorganic material comprises functionalized-metal-chalcogen-halogen or functionalized/organically modified carbon based nano wires/tubes and further comprises a charge separation material provided in the bulk hetero junction as a middle layer, which comprises at least of one fullerene derivative mixed with a light absorbing and efficient exciton generating polymer, such that phenomena like efficient light absorption/exciton dissociation at intra bulk hetro junction phase boundaries and efficient charge transport can take place in between the middle layer containing the bulk hetro junction and the outer layer hole transporting and inner layer providing the innermost electron carrying structures of the three layers co-axial electrospun organic-inorganic solar cell, respectively.

3. The organic-inorganic solar cell, of claim 2, wherein the organic-inorganic solar cell is configured as a tandem solar cell, by repeating a plurality of the active layers.

4. An organic-inorganic hybrid cell comprising the organic-inorganic solar cell of claim 1 that is combined with electrospinning or a spinning technique selected from wet, dry, melt, extrusion, and gel spinning at micro or macro level, such that a Photoelectrochemical Cell (PEC) could be realized by incorporating oxygen emitting compounds into the anodic layer, for the oxygen evolution via water/aqueous electrolyte splitting, under an adequate generated potential, with possible subsequent storage of part of the evolved hydrogen gas, at the cathode, into locally dispersed adsorbents in a co-axial chamber.

5. The organic-inorganic hybrid cell, of claim 4, constructed separately, at macro scale keeping the same ideology, for dissociation of adsorbed water content from the aqueous electrolytic solution, in the anode layer; such that the relevant PEC-co-axial layers could be submitted to an adequate potential difference and hence its circuit could be completed with the electrons produced from the organic-inorganic solar cell, whereby part of the evolved hydrogen in the cathode chamber can be stored in situ, via locally dispersed adsorbents.

6. The organic-inorganic hybrid cell of claim 4, wherein any additional power source, which can provide a net potential difference of >1.23 V for water splitting, thereby evolving oxygen from the anode chamber and hydrogen from the cathode chamber, part of which is envisaged to be stored, in situ, into nanocomposite adsorbents dispersed locally.

7. The organic-inorganic hybrid cell of claim 4, exploiting a plurality of active layers and hence the radial multi-stage co-axial chambers, thereby incorporating, in situ, at micro scale or separately at a macro scale, an innovative fuel cell with the electrodes made in line with the layered hydrotalcite like nanocomposites, to function as a catalyst for hydrogen or methanol/ethanol as fuel, and as an in situ hydrogen adsorbents, whereby, excess, un-adsorbed hydrogen could be consumed near their production site when coming in contact with the interfacial anode with atmospheric air inflow into the core of the co-axial empty structure, assuring atmospheric oxygen dissociation at the cathode with appropriate electrolytic membrane material obtained via respective electrolytes' percolation into a water soluble co-polymer, used for coaxial section creation.

8. The organic-inorganic hybrid cell of claim 4, wherein the anode, cathode and hydrogen adsorbents are synthesized as hydrotalcite like materials and dispersed along with: hole conducting nanomaterials into the chamber; while with electron conducting inorganic or carbon based nanomaterials in the co-axial chamber; whereas in the form of their dehydrated oxides, or as catalyzed room temperature hydrogen adsorbents; respectively.

9. The organic-inorganic hybrid cell of claim 4, wherein the presence of the PEC and/or fuel cell combination, into the remaining half of the co-axial plural layers.

10. The organic-inorganic solar cell of claim 2 further comprising CIGS like/replica material as an absorbing layer.

11. The organic-inorganic solar cell of claim 1 wherein the acids comprise perfluorosulfonic acid, deoxyribonucleic acid, HEME B, delta 9 tetrahydrocannabinol, cannabidiol (CBD), coumarin-3-carboxylic acid (coumarin), and fluorescein.

12. The organic-inorganic hybrid cell of claim 7, wherein the interfacial anode is made up of platinum nanoparticles or an anodic material which can efficiently function as hydrogen dissociation catalyst(s), along with atmospheric air inflow into the core of the co-axial empty structure, assuring atmospheric oxygen dissociation at the cathode; wherein the cathode is based on a nickel catalyst; and wherein, the appropriate electrolytic membrane material is composed of perfluorosulfonic acid or potassium hydroxide soaked polymer matrix, or phosphoric acid soaked polymer matrix.

13. The organic-inorganic solar cell of claim 1, wherein the lanthanide elements are selected from a group consisting of Nd3+, Sm3+, Eu3+, Gd3+, Er3+, Tm3+ and Yb3+.

14. The organic-inorganic solar cell of claim 1 wherein the hydrotalcite like layered double hydroxide compound is described by an empirical formula as follows:

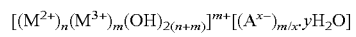

where $M^{2+}$ and $M^{3+}$ are metal cations, permissible also in their oxidised or reduced form, A represents a x-valent anion(s) as sought in claim 1, x is the charge of the anion and y is the number of interlayer water molecules.

15. The organic-inorganic solar cell of claim 1 wherein a typical nanoscale photoelectrochemical cell (PEC) can be envisaged in the presence of an intercalated or encapsulated light harvesting species (donor/acceptor pair), such that the nanocomposite when deposited onto an anode substrate, dissociates neighbouring water through the in situ generated 'sum' potential, with possible simultaneous, adsorption of part of the evolved hydrogen, at the 2D lamella containing oxide phases.

16. The organic-inorganic solar cell of claim 15, wherein the intercalated or encapsulated donor/acceptor pair can be any combinations of the organic compounds, with similar light harvesters grown directly on the layered double hydroxide 2D lamella, as in, inorganic (Quantum dots or rods or tetrapods), or as metal oxides from M (I-IV) ion, inserted into the 2D lamella and oxidized with the dissolved oxygen; with intercalated entity as its sensitizers.

\* \* \* \* \*